US011283000B2

(12) United States Patent
Kasichainula

(10) Patent No.: US 11,283,000 B2
(45) Date of Patent: *Mar. 22, 2022

(54) METHOD OF PRODUCING A FLEXIBLE THERMOELECTRIC DEVICE TO HARVEST ENERGY FOR WEARABLE APPLICATIONS

(71) Applicant: Sridhar Kasichainula, Fremont, CA (US)

(72) Inventor: Sridhar Kasichainula, Fremont, CA (US)

(73) Assignee: NIMBUS MATERIALS INC., Fremont, CA (US)

(\*) Notice: Subject to any disclaimer, the term of this patent is extended or adjusted under 35 U.S.C. 154(b) by 101 days.

This patent is subject to a terminal disclaimer.

(21) Appl. No.: 16/503,458

(22) Filed: Jul. 3, 2019

(65) Prior Publication Data

US 2019/0326500 A1 Oct. 24, 2019

Related U.S. Application Data

(63) Continuation of application No. 15/059,286, filed on Mar. 2, 2016, now Pat. No. 10,388,847, which is a (Continued)

(51) Int. Cl.
*H01L 35/34* (2006.01)
*H01L 35/10* (2006.01)
*H01L 35/08* (2006.01)

(52) U.S. Cl.
CPC ............. *H01L 35/34* (2013.01); *H01L 35/08* (2013.01); *H01L 35/10* (2013.01)

(58) Field of Classification Search
CPC ...................................................... H01L 35/34
See application file for complete search history.

(56) References Cited

U.S. PATENT DOCUMENTS 3,081,361 A 3/1963 Henderson et al.
3,197,342 A 7/1965 Neild, Jr.
(Continued)

FOREIGN PATENT DOCUMENTS

CN 1505252 A 6/2004
CN 1975448 A 6/2007
(Continued)

OTHER PUBLICATIONS

"Evaluating Energy-Harvesting Technologies for Wearable Designs", Article Library, Contributed By Publitek Marketing Communications, Dec. 3, 2014 by European Editors (pp. 4) http://www.digikey.com/en/articles/techzone/2014/dec/evaluating-energy-harvesting-technologies-for-wearable-designs.

(Continued)

*Primary Examiner* — Sadie White
(74) *Attorney, Agent, or Firm* — LegalForce RAPC Worldwide

(57) ABSTRACT

A method and/or apparatus of energy harvesting for wearable technology through a thin flexible thermoelectric device is disclosed. A lower conduction layer is formed on top of a lower dielectric layer. An active layer, comprising at least one thin film thermoelectric conduit and a thermal insulator, is formed above the lower conduction layer. An internal dielectric layer is formed above the active layer, and contact holes are drilled above each thermoelectric conduit. An upper conduction layer and upper dielectric layer are formed, connecting the thermoelectric conduits in series. The resulting flexible thermoelectric device generates a voltage when exposed to a temperature gradient.

20 Claims, 20 Drawing Sheets

Related U.S. Application Data continuation-in-part of application No. 14/711,810, filed on May 14, 2015, now Pat. No. 10,141,492.

(56) References Cited

U.S. PATENT DOCUMENTS

| | | | |
|---|---|---|---|
| 3,458,356 A | 7/1969 | Kummer et al. | |
| 3,508,968 A | 4/1970 | Ovshinsky | |
| 3,554,815 A | 1/1971 | Osborn | |
| 3,616,590 A | 11/1971 | Ulrich et al. | |
| 3,648,152 A | 3/1972 | Katsunori | |
| 3,666,566 A | 5/1972 | Flaherty | |
| 3,851,381 A | 12/1974 | Alais et al. | |
| 3,995,429 A | 12/1976 | Peters | |
| 4,036,665 A | 7/1977 | Barr et al. | |
| 4,039,352 A | 8/1977 | Marinescu | |
| 4,095,998 A | 6/1978 | Hanson | |
| 4,106,279 A | 8/1978 | Martin et al. | |
| 4,125,122 A | 11/1978 | Stachurski | |
| 4,213,292 A | 7/1980 | Dolezal et al. | |
| 4,251,291 A | 2/1981 | Gomez | |
| 4,338,560 A | 7/1982 | Lemley | |
| 4,382,154 A | 5/1983 | Thery et al. | |
| 4,443,650 A | 4/1984 | Takagi et al. | |
| 4,448,028 A | 5/1984 | Chao et al. | |
| 4,467,611 A | 8/1984 | Nelson et al. | |
| 4,497,973 A | 2/1985 | Heath et al. | |
| 4,551,857 A | 11/1985 | Galvin | |
| 4,673,863 A | 6/1987 | Swarbrick | |
| 4,946,511 A | 8/1990 | Shiloh et al. | |
| 5,180,928 A | 1/1993 | Choi | |
| 5,286,304 A | 2/1994 | Macris et al. | |
| 5,419,780 A | 5/1995 | Suski | |
| 5,427,086 A | 6/1995 | Brownell | |
| 5,521,375 A | 5/1996 | Jang | |
| 5,554,819 A | 9/1996 | Baghai-Kermani | |
| 5,563,368 A | 10/1996 | Yamaguchi | |
| 5,625,245 A | 4/1997 | Bass | |
| 5,705,770 A | 1/1998 | Ogasawara et al. | |
| 5,712,448 A | 1/1998 | Vandersande et al. | |
| 5,817,188 A | 10/1998 | Yahatz et al. | |
| 5,889,735 A | 3/1999 | Kawata et al. | |
| 5,892,656 A | 4/1999 | Bass | |
| 5,929,372 A | 7/1999 | Oudoire et al. | |
| 5,950,067 A | 9/1999 | Maegawa et al. | |
| 5,959,240 A | 9/1999 | Yoshida et al. | |
| 6,043,423 A | 3/2000 | Satomura et al. | |
| 6,066,902 A | 5/2000 | Maurio et al. | |
| 6,075,199 A | 6/2000 | Wong | |
| 6,127,619 A * | 10/2000 | Xi | H01L 35/16 136/201 |
| 6,166,317 A | 12/2000 | Volk, Jr. | |
| 6,207,887 B1 | 3/2001 | Bass et al. | |
| 6,271,459 B1 | 8/2001 | Yoo | |
| 6,281,594 B1 | 8/2001 | Sarich | |
| 6,300,150 B1 | 10/2001 | Venkatasubramanian | |
| 6,304,520 B1 | 10/2001 | Watanabe | |
| 6,307,142 B1 | 10/2001 | Allen et al. | |
| 6,313,393 B1 | 11/2001 | Drost | |
| 6,314,741 B1 | 11/2001 | Hiraishi | |
| 6,320,280 B1 | 11/2001 | Kanesaka | |
| 6,329,217 B1 | 12/2001 | Watanabe et al. | |
| 6,367,261 B1 | 4/2002 | Marshall et al. | |
| 6,407,965 B1 | 6/2002 | Matoge | |
| 6,410,971 B1 | 6/2002 | Otey | |
| 6,426,921 B1 | 7/2002 | Mitamura | |
| 6,433,465 B1 | 8/2002 | McKnight et al. | |
| 6,548,894 B2 | 4/2003 | Chu et al. | |
| 6,598,405 B2 | 7/2003 | Bell | |
| 6,605,773 B2 | 8/2003 | Kok et al. | |
| 6,620,994 B2 | 9/2003 | Rossi | |
| 6,700,310 B2 | 3/2004 | Maue et al. | |
| 6,729,183 B2 | 5/2004 | Tanimoto et al. | |
| 6,846,983 B1 | 1/2005 | Warehime | |
| 6,870,766 B2 | 3/2005 | Cho et al. | |
| 6,882,128 B1 | 4/2005 | Rahmel et al. | |
| 6,914,343 B2 | 7/2005 | Hiller et al. | |
| 7,081,693 B2 | 7/2006 | Hamel et al. | |
| 7,282,384 B2 | 10/2007 | Shin et al. | |
| 7,360,365 B2 | 4/2008 | Codecasa et al. | |
| 7,397,169 B2 | 7/2008 | Nersessian et al. | |
| 7,400,050 B2 | 7/2008 | Jovanovic et al. | |
| 7,488,888 B2 | 2/2009 | Mitchell et al. | |
| 7,493,766 B2 | 2/2009 | Yang et al. | |
| 7,532,937 B2 | 5/2009 | Horio et al. | |
| 7,649,139 B2 | 1/2010 | Mihara et al. | |
| 7,770,645 B2 | 8/2010 | Jeffryes | |
| 7,777,126 B2 | 8/2010 | Chu | |
| 7,800,194 B2 | 9/2010 | Freedman | |
| 7,800,278 B2 | 9/2010 | Ujihara et al. | |
| 7,834,263 B2 | 11/2010 | DeSteese et al. | |
| 7,851,691 B2 | 12/2010 | DeSteese et al. | |
| 7,851,932 B2 | 12/2010 | Rome et al. | |
| 7,878,283 B2 | 2/2011 | Richter et al. | |
| 7,939,743 B2 | 5/2011 | Leng et al. | |
| 8,046,993 B2 | 11/2011 | Kao | |
| 8,216,871 B2 | 7/2012 | McCann | |
| 8,237,043 B2 | 8/2012 | Kondoh | |
| 8,269,097 B2 | 9/2012 | Asatani et al. | |
| 8,269,098 B2 | 9/2012 | Chu | |
| 8,294,020 B2 | 10/2012 | Mitchell et al. | |
| 8,404,959 B2 | 3/2013 | Donley | |
| 8,404,960 B2 | 3/2013 | Prather et al. | |
| 8,421,313 B2 | 4/2013 | Shih et al. | |
| 8,421,403 B2 | 4/2013 | Newman | |
| 8,519,505 B2 | 8/2013 | Hiroshige et al. | |
| 8,519,595 B2 | 8/2013 | Hunter et al. | |
| 8,594,803 B2 | 11/2013 | Magdych | |
| 8,604,571 B2 | 12/2013 | Uchida | |
| 8,653,357 B2 | 2/2014 | Prather et al. | |
| 8,685,758 B2 | 4/2014 | Suzuki et al. | |
| 8,777,441 B2 | 7/2014 | Vazquez | |
| 8,802,964 B2 | 8/2014 | Meng et al. | |
| 8,948,870 B2 | 2/2015 | Imran | |
| 8,952,235 B2 | 2/2015 | Span et al. | |
| 8,975,503 B2 | 3/2015 | Mitchell et al. | |
| 9,215,905 B2 | 12/2015 | Tseng | |
| 9,224,936 B2 | 12/2015 | Nakamura et al. | |
| 9,431,593 B2 | 8/2016 | Kato et al. | |
| 9,455,390 B2 | 9/2016 | Kurihara et al. | |
| 10,388,847 B2 * | 8/2019 | Kasichainula | H01L 35/34 |
| 2002/0047489 A1 | 4/2002 | Oudakker | |
| 2002/0117198 A1 | 8/2002 | Kok et al. | |
| 2002/0148235 A1 | 10/2002 | Bell | |
| 2003/0223919 A1 | 12/2003 | Kwak et al. | |
| 2004/0045594 A1 | 3/2004 | Hightower | |
| 2004/0094192 A1 | 5/2004 | Luo | |
| 2004/0177876 A1 | 9/2004 | Hightower | |
| 2004/0183306 A1 | 9/2004 | Rome | |
| 2004/0238022 A1 | 12/2004 | Hiller et al. | |
| 2005/0000559 A1 | 1/2005 | Horio et al. | |
| 2005/0022855 A1 | 2/2005 | Raver | |
| 2005/0087222 A1 | 4/2005 | Muller-Werth | |
| 2005/0115600 A1 | 6/2005 | DeSteese et al. | |
| 2005/0139248 A1 | 6/2005 | Strnad | |
| 2005/0139250 A1 | 6/2005 | DeSteese et al. | |
| 2005/0205125 A1 | 9/2005 | Nersessian et al. | |
| 2005/0236028 A1 | 10/2005 | Strnad | |
| 2006/0048807 A1 | 3/2006 | Lee et al. | |
| 2006/0107990 A1 | 5/2006 | Adachi et al. | |
| 2006/0118157 A1 | 6/2006 | Johnson et al. | |
| 2006/0130888 A1 | 6/2006 | Yamaguchi et al. | |
| 2006/0201161 A1 | 9/2006 | Hirai et al. | |
| 2006/0207643 A1 | 9/2006 | Weaver et al. | |
| 2006/0208492 A1 | 9/2006 | Jovanovic et al. | |
| 2006/0243317 A1 | 11/2006 | Venkatasubramanian | |
| 2006/0254638 A1 | 11/2006 | Carmeli et al. | |
| 2007/0000068 A1 | 1/2007 | Gerard France et al. | |
| 2007/0028956 A1 | 2/2007 | Venkatasubramanian et al. | |
| 2007/0056622 A1 | 3/2007 | Leng et al. | |
| 2007/0095379 A1 | 5/2007 | Taher et al. | |
| 2007/0125413 A1 | 6/2007 | Olsen et al. | |
| 2007/0193617 A1 | 8/2007 | Taguchi | |
| 2007/0283702 A1 | 12/2007 | Strnad | |
| 2007/0290287 A1 | 12/2007 | Freedman | |

(56) References Cited

U.S. PATENT DOCUMENTS

| | | |
|---|---|---|
| 2008/0017238 A1 | 1/2008 | Fei et al. |
| 2008/0065172 A1 | 3/2008 | Magdych |
| 2008/0066796 A1 | 3/2008 | Mitchell et al. |
| 2008/0092937 A1 | 4/2008 | Mitchell et al. |
| 2008/0121263 A1* | 5/2008 | Schutte .................. H01L 35/34 136/203 |
| 2008/0173537 A1 | 7/2008 | DeSteese et al. |
| 2008/0264464 A1 | 10/2008 | Lee et al. |
| 2008/0283110 A1 | 11/2008 | Jin et al. |
| 2009/0000652 A1 | 1/2009 | von Windheim et al. |
| 2009/0025773 A1 | 1/2009 | Stark |
| 2009/0217960 A1 | 9/2009 | Tubel et al. |
| 2009/0260358 A1 | 10/2009 | Rapp et al. |
| 2009/0315335 A1 | 12/2009 | Ujihara et al. |
| 2010/0063557 A1 | 3/2010 | Imran |
| 2010/0065096 A1 | 3/2010 | Pellegrini |
| 2010/0154855 A1 | 6/2010 | Nemir et al. |
| 2010/0186399 A1 | 7/2010 | Huttinger |
| 2010/0257871 A1 | 10/2010 | Venkatasubramanian et al. |
| 2010/0300504 A1 | 12/2010 | Parisi et al. |
| 2010/0319745 A1 | 12/2010 | Meng et al. |
| 2011/0084349 A1 | 4/2011 | Uchida et al. |
| 2011/0139398 A1 | 6/2011 | Bauer et al. |
| 2011/0140458 A1 | 6/2011 | Arnold et al. |
| 2011/0169372 A1 | 7/2011 | Lim |
| 2011/0220162 A1 | 9/2011 | Siivola et al. |
| 2012/0000500 A1 | 1/2012 | Iida et al. |
| 2012/0081066 A1 | 4/2012 | Newman |
| 2012/0160290 A1 | 6/2012 | Chen et al. |
| 2012/0192910 A1 | 8/2012 | Fowler et al. |
| 2012/0227779 A1 | 9/2012 | Miao et al. |
| 2012/0291425 A1 | 11/2012 | Mitchell et al. |
| 2012/0312343 A1 | 12/2012 | VanVechten et al. |
| 2013/0019460 A1 | 1/2013 | Mayes |
| 2013/0021002 A1 | 1/2013 | Mayes |
| 2013/0021788 A1 | 1/2013 | Mayes |
| 2013/0074897 A1* | 3/2013 | Yang .................. H01L 35/34 136/200 |
| 2013/0087180 A1 | 4/2013 | Stark et al. |
| 2013/0206199 A1 | 8/2013 | Lassiter et al. |
| 2013/0249301 A1 | 9/2013 | Smoot et al. |
| 2013/0298957 A1 | 11/2013 | Hiroshige et al. |
| 2014/0015470 A1 | 1/2014 | Lim et al. |
| 2014/0020728 A1 | 1/2014 | Chung |
| 2014/0090150 A1 | 4/2014 | Skertic |
| 2014/0096810 A1 | 4/2014 | Nakamura et al. |
| 2014/0137917 A1 | 5/2014 | Al-Merbati et al. |
| 2014/0159637 A1 | 6/2014 | Ebersold |
| 2014/0246066 A1 | 9/2014 | Chen et al. |
| 2014/0299169 A1 | 10/2014 | Schneider et al. |
| 2014/0326287 A1 | 11/2014 | Wiant et al. |
| 2014/0345666 A1 | 11/2014 | Konnai et al. |
| 2014/0348453 A1 | 11/2014 | Bartl et al. |
| 2014/0360548 A1 | 12/2014 | Bartl et al. |
| 2014/0373888 A1 | 12/2014 | Boukai et al. |
| 2014/0375246 A1 | 12/2014 | Boysen, III et al. |
| 2015/0048249 A1 | 2/2015 | Hedler et al. |
| 2015/0162517 A1 | 6/2015 | Kasichainula |
| 2015/0188019 A1 | 7/2015 | Corrado et al. |
| 2015/0214823 A1 | 7/2015 | Shastry et al. |
| 2015/0282227 A1 | 10/2015 | Yousef et al. |
| 2015/0324181 A1 | 11/2015 | Segal |
| 2016/0006123 A1 | 1/2016 | Li et al. |
| 2016/0233402 A1 | 8/2016 | Suda et al. |
| 2016/0336501 A1 | 11/2016 | Kasichainula |
| 2017/0012195 A1 | 1/2017 | Grishin |

FOREIGN PATENT DOCUMENTS

| | | |
|---|---|---|
| CN | 101454914 A | 6/2009 |
| CN | 201739025 U | 2/2011 |
| CN | 201781448 U | 3/2011 |
| CN | 201830182 U | 5/2011 |
| CN | 202005376 U | 10/2011 |
| CN | 102629842 A | 8/2012 |
| CN | 202602564 U | 12/2012 |
| CN | 102891635 A | 1/2013 |
| CN | 202651208 U | 1/2013 |
| CN | 202713203 U | 1/2013 |
| CN | 202978757 U | 6/2013 |
| CN | 203086385 U | 7/2013 |
| CN | 203119810 U | 8/2013 |
| CN | 103325935 A | 9/2013 |
| CN | 103534826 A | 1/2014 |
| CN | 204168164 U | 2/2015 |
| CN | 104638742 A | 5/2015 |
| CN | 103178754 B | 7/2015 |
| CN | 204669251 U | 9/2015 |
| DE | 2355863 A1 | 5/1974 |
| DE | 3735410 A1 | 5/1989 |
| DE | 3807633 A1 | 9/1989 |
| DE | 4118979 A1 | 12/1992 |
| DE | 4208358 A1 | 9/1993 |
| DE | 4313827 A1 | 11/1994 |
| DE | 19732399 A1 | 2/1999 |
| DE | 19919023 A1 | 12/2000 |
| DE | 10004390 C2 | 5/2002 |
| DE | 10112383 B4 | 1/2004 |
| DE | 29724918 U1 | 8/2006 |
| DE | 102606014414 A1 | 10/2007 |
| DE | 102006039024 A1 | 2/2008 |
| DE | 102006057662 A1 | 6/2008 |
| DE | 102008030758 A1 | 1/2009 |
| DE | 102008005334 A1 | 7/2009 |
| DE | 102008009979 A1 | 9/2009 |
| DE | 202010003713 U1 | 7/2010 |
| DE | 202010011515 U1 | 11/2010 |
| DE | 102008031266 B4 | 5/2013 |
| DE | 102007017461 B4 | 4/2014 |
| EP | 0117743 A3 | 11/1986 |
| EP | 0644599 A2 | 3/1995 |
| EP | 0935334 A2 | 8/1999 |
| EP | 0993117 A3 | 2/2002 |
| EP | 2764268 B1 | 8/2015 |
| JP | 2003102186 A | 4/2003 |
| JP | 3447915 B2 | 9/2003 |
| JP | 2005228160 A | 8/2005 |
| JP | 2006086510 A | 3/2006 |
| JP | 2013225550 A | 10/2013 |
| JP | 3196069 U | 2/2015 |
| KR | 20160109658 A | 9/2016 |
| WO | 1985005406 A1 | 12/1985 |
| WO | 1989007836 A1 | 8/1989 |
| WO | 1995030246 A1 | 11/1995 |
| WO | 1997045882 A1 | 12/1997 |
| WO | 1999007024 A1 | 2/1999 |
| WO | 1999010937 A1 | 3/1999 |
| WO | 2001082343 A2 | 11/2001 |
| WO | 2003007391 A1 | 1/2003 |
| WO | 2003015186 A2 | 2/2003 |
| WO | 2005086246 A2 | 9/2005 |
| WO | 2005098225 A1 | 10/2005 |
| WO | 2006003956 A1 | 1/2006 |
| WO | 2006001827 A3 | 4/2006 |
| WO | 2006110858 A2 | 10/2006 |
| WO | 2008013584 A2 | 1/2008 |
| WO | 2008025701 A2 | 3/2008 |
| WO | 2008095582 A1 | 8/2008 |
| WO | 2008134022 A2 | 11/2008 |
| WO | 2007142934 A3 | 12/2008 |
| WO | 2009045662 A3 | 11/2009 |
| WO | 2009151000 A1 | 12/2009 |
| WO | 2010048066 A2 | 4/2010 |
| WO | 2010101049 A1 | 9/2010 |
| WO | 2010113257 A1 | 10/2010 |
| WO | 2010138835 A2 | 12/2010 |
| WO | 2011091620 A1 | 8/2011 |
| WO | 2012130568 A1 | 10/2012 |
| WO | 2012165990 A1 | 12/2012 |
| WO | 2013050415 A1 | 4/2013 |
| WO | 2013108518 A1 | 7/2013 |
| WO | 2013109729 A1 | 7/2013 |
| WO | 2013135447 A1 | 9/2013 |

(56) References Cited

FOREIGN PATENT DOCUMENTS

| WO | 2014064755 A1 | 5/2014 |
|---|---|---|
| WO | 2014082028 A1 | 5/2014 |
| WO | 2015045500 A1 | 4/2015 |
| WO | 2015103483 A1 | 7/2015 |
| WO | 2015126272 A1 | 8/2015 |
| WO | 2015148411 A1 | 10/2015 |
| WO | 2015164903 A1 | 11/2015 |
| WO | 2015193177 A2 | 12/2015 |
| WO | 2015193634 A1 | 12/2015 |
| WO | 2016003482 A1 | 1/2016 |
| WO | 2016147918 A1 | 9/2016 |

OTHER PUBLICATIONS

"Energy Harvesting Moves into Wearable Electronics", Article Library, Contributed By Publitek Marketing Communications, Feb. 15, 2012 by European Editors (pp. 5) http://www.digikey.com/en/articles/techzone/2012/feb/energy-harvesting-moves-into-wearable-electronics.

"Top 5 Energy Harvesting Options for Wearable Devices", Avnet, 2016 by James C. Hess (pp. 2) http://www.em.avnet.com/en-us/design/technical-articles/Pages/Articles/Top-5-Energy-Harvesting-Options-for-Wearable-Devices.aspx.

"Review of Energy Harvesting Techniques and Applications for Microelectronics", Polytechnic University of Catalonia, Department of Electronic Engineering Barcelona, Spain, 2005 by Loreto Mateu et al. (p. 1) http://upcommons.upc.edu/handle/2117/613?locale-attribute=en.

"Energy Harvesting Technology Can Be the Wave of the Future", Wearable Technologies Conference, San Fransisco, Jul. 13, 2015 by by Spela Kosir (pp. 8) https://www.wearable-technologies.com/2015/07/energy-harvesting-technology-can-be-the-wave-of-the-future/.

"Thermoelectric Energy Harvesting 2014-2024: Devices, Applications, Opportunities", IDTechEx by Dr Harry Zervos (pp. 3) http://www.idtechex.com/research/reports/thermoelectric-energy-harvesting-2014-2024-devices-applications-opportunities-000392.asp.

"TEGwear™ Technology", Perpetua—Renewable Energy Solutions for Wireless Sensors, 2015 (p. 1) http://www.perpetuapower.com/technology.htm.

"Thin-film Thermoelectric—Energy Harvesting for Internet of things", Thermogen, 2016 (pp. 4) http://www.thermogentech.com/#services.

"Thermoelectric Fabrics: Toward Power Generating Clothing", Scientific Reports 5, Article No. 6411, Mar. 23, 2015 by Yong Du et al. (pp. 15) http://www.nature.com/articles/srep06411.

"Energy harvesting for assistive and mobile applications", Energy Science and Engineering, vol. 3, Issue 3, Feb. 17, 2015 by Vikrant Bhatnagar et al. (pp. 14) http://onlinelibrary.wiley.com/doi/10.1002/ese3.63/full.

"A Shoe-Embedded Piezoelectric Energy Harvester for Wearable Sensors", Sensors, Jul. 11, 2014 by Jingjng Zhao et al. (pp. 9) http://www.ncbi.nlm.nih.gov/pmc/articies/PMC4168512/.

"Energy Harvesting Peltier Ring", HackADay, Feb. 2, 2016 by James Hobson (p. 1) http://hackaday.com/2013/12/02/energy-harvesting-peltier-ring/.

"Recharging Batteries using Energy Harvested from Thermal Gradients", Journal of Intelligent Material Systems and Structures, Department of Mechanical Engineering, Michigan Technological University, Jan. 2007 by Henry A. Sodano et al. (p. 1) http://jim.sagepub.com/content/18/1/3.short.

"Flexible Thin-film Thermoelectric Generator Inserting cr Buffer Layer", National Institute of Advanced Industrial Science and Technology, Dec. 2, 2012 by M. Mizoshiri et al. (pp. 4) http://cap.ee.ic.ac.uk/~pdm97/powermems/2012/poster/P-058.pdf.

"Miniaturized Thermoelectric Power Sources", 34th intersociety Energy Conversion Engineering Conference Proc., Vancouver, BC, Canada, 1999 by J. P. Fleurial et al. (pp. 5) http://www.thermoelectrics.caltech.edu/pubiications/pdf/IECEC-992569-Paper.pdf.

"Flexible Thermoelectric Materials and Device Optimization for Wearable Energy Harvesting", Journal of Materials Chemistry C, Materials for optical, magnetic and electronic devices, Issue 40, Jul. 1, 2015 by Je-Hyeong Bahk et al. (p. 1) http://pubs.rsc.org/en/Content/ArticleLanding/2015/TC/c5tc01644d#IdivAbstract.

"Thick-film Thermoelectric. Microdevices", IEEE Xplore, Sep. 2, 1999 by J. P. Fleurial et al. (pp. 2) http://ieeexplore.ieee.org/xpl/login,jsp?tp=&arnumber=843388&url=http%3A%2F%2Fieeexplore.ieee.org%2Fiel5%2F6791%2F18227%2F00843388.pdi%3Farnumber%3D843388.

"Thermoelectric Microconverter for Energy Harvesting Systems", Industrial Electronics, IEEE, Oct. 20, 2009 by J. P. Carmo et al. (pp. 2) http://ieeexplore.ieee.org/xpl/login.jsp?tp=&arnumber=5290158&url=http%3A%2F%2Fieeexplore.ieee.org%2Fxpls%2Fabs_all.jsp%3Farnumber%3D5290158.

"New Micro Thermoelectric Devices Based on Bismuth Telluride-type Thin Solid Films", IEEE Xplore, Sep. 2, 1999 by Stark et al. (pp. 2) http://ieeexplore.ieee.org/xpl/login.jsp?tp-&arnumber=:843432&url=http%3A%2F%2Fieeexplore.ieee.org%2Fxpls%2Fabs_all.jsp%3Farnumber%3b843432.

"Modelling and Experimental Verification of a Ge/SiGe Thermoelectric Generator", IEEE Xplore, Jul. 2, 2015 by A. Odia et al. (pp. 2) http://ieeexplore.ieee.org/xpl/articleDetails.jsp?arnumber=7251383&queryText=voltage%20generating%20thermoeiectric%20device&newsearch=true.

"Thermoelectric Power Generator Design and Selection from TE Cooling Module Specifications", IEEE Xplore, Aug. 29, 1997 by R.J. Buist et al. (pp. 2) http://ieeexplore.ieee.org/xpl/articleDetails.jsp?arnumber=667589&queryText=voltage%20generating%20thermoelectric%20device&newsearch=true.

"A Dual Mode Thermoelectric Energy Harvesting Circuit Using Transformer-Based Boost Converter, Charge pump and Time-domain Digital Control", IEEE Xplore, Jun. 20, 2014 by Ying-Khai Teh et al. (pp. 2) http://ieeexplore.ieee.org/xpl/articleDetails.jsp?arnumber=7061101&queryText=voltage%20generating%20thermoelectric%20device&pageNumber=2&newsearch=true&searchField=Search_All.

"Power Generation of Thermoelectric Oxide Modules", IEEE Xplore, Jun. 23, 2005 by R. Funahashi et al. (pp. 2) http://ieeexplore.ieee.org/xpl/articleDetails.jsp?arnumber=1519947&queryText=voltage%20generating%20thermoelectric%20device&pageNumber=2&newsearch=true&searchField=Search_All.

"Nonlinear Anisotropic Thermoelectric Energy Converter Based on Semiconductor Films", IEEE Xplore, Aug. 21, 2003 by L.P. Bulat (pp. 2) http://ieeexplore.ieee.org/xpl/articleDetails.jsp?arnumber=1287525&queryText=voltage%20generating%20thermoelectric%20device&pageNumber=2&newsearch=true&searchField=Search_All.

"Thermoelectric Generator for Heat Meter", IEEE Xplore, 2001 by Xiaoguang Liu et al. (pp. 2) http://ieeexplore.ieee.org/xpl/articleDetails.jsp?arnumber=979920&queryText=voltage%20generating%20thermoelectric%20device&pageNumber=2&newsearch=true&searchField=Search_All.

"Mixed Thick-/Thin Film Thermoelectric Microgenerators", IEEE Xplore, Sep. 4, 2008 by P. Markowski et al. (pp. 2) http://ieeexplore.ieee.org/xpl/articleDetails.jsp?arnumber=4684419&queryText=voltage%20generating%20thermoelectric%20device&pageNumber=2&newsearch=true&searchField=Search_All.

\* cited by examiner

METHOD OF PRODUCING A FLEXIBLE THERMOELECTRIC DEVICE TO HARVEST ENERGY FOR WEARABLE APPLICATIONS

CLAIM OF PRIORITY

This application is a Continuation and a Divisional Application of U.S. patent application Ser. No. 15/059,286 titled A METHOD OF PRODUCING A FLEXIBLE THERMOELECTRIC DEVICE TO HARVERST ENERGY FOR WEARABLE APPLICATIONS filed on Mar. 2, 2016. U.S. patent application Ser. No. 15/059,286 itself is a Continuation-In-Part application of U.S. patent application Ser. No. 14/711,810 titled ENERGY HARVESTING FOR WEARABLE TECHNOLOGY THROUGH A THIN FLEXIBLE THERMOELECTRIC DEVICE filed on May 14, 2015 and issued as U.S. Pat. No. 10,141,492 on Nov. 27, 2018. The contents of the aforementioned applications are incorporated by reference in entirety thereof.

FIELD OF TECHNOLOGY

This disclosure relates generally to energy production, more particularly, to energy harvesting for wearable technology through a flexible thermoelectric device.

BACKGROUND

A thermoelectric device is able to directly convert heat (i.e. a temperature gradient) into electricity. If their efficiency may be increased and the operational temperatures reduced to near room temperature (300K), thermoelectric devices may begin to supplement or even supplant traditional power sources used in wearable or internet of things (IoT) devices. High thermal conductivity with lower electrical conductivity may prevent higher efficiency. Unfortunately, there are no single materials that possess simultaneously higher electrical conductivity and lower thermal conductivity. Low efficiency and high operating temperatures, combined with higher cost, prohibit current thermoelectric devices from wider market adoption.

Low efficiency may relegate thermoelectric devices to a few applications where their simplicity and ruggedness may outweigh the inefficiency, such as sensors and waste-heat-energy converters. The current market products are often used in conjunction with either heat sink or active cooling at high temperatures for industrial use cases. Additionally, the current state of the art thermoelectric devices are rigid and bulky, and are produced using complex processes which scale poorly, resulting in higher cost. As a result, current thermoelectric devices, being expensive, inefficient near room temperature, rigid, and bulky, are less than ideal for use in wearable or internet of things (IoT) devices.

SUMMARY

Disclosed is a method of producing a flexible thermoelectric device to harvest energy for wearable applications. It will be appreciated that the various embodiments discussed herein need not necessarily belong to the same group of exemplary embodiments, and may be grouped into various other embodiments not explicitly disclosed herein. In the following description, for purposes of explanation, numerous specific details are set forth in order to provide a thorough understanding of the various embodiments. Accordingly, the specification and drawings are to be regarded in an illustrative rather than a restrictive sense.

In one aspect, a method of producing a flexible thermoelectric device includes drilling a number of P-designated contact holes through a flexible coverlay each corresponding to a P-type conduit of a number of P-type conduits directly on top of a lower conduction layer of the flexible thermoelectric device, and a number of N-designated contact holes through the flexible coverlay each corresponding to an N-type conduit of a number of N-type conduits directly on top of the lower conduction layer, and aligning the number of P-type conduits and the number of N-type conduits under the flexible coverlay such that the each P-designated contact hole of the flexible coverlay is directly above one of the P-type conduits and the each N-designated contact hole of the flexible coverlay is directly above one of the N-type conduits. The flexible coverlay includes a layer of adhesive under an internal dielectric layer.

Each P-type conduit is electrically connected to one of the N-type conduits through the lower conduction layer directly above a lower dielectric layer of the flexible thermoelectric device. The method also includes laminating the flexible coverlay on top of the lower conduction layer by pressing the flexible coverlay against the lower conduction layer such that the layer of adhesive deforms and fills a space around the each of the P-type conduits and each of the N-type conduits, and the flexible coverlay is attached to the lower conduction layer through the layer of adhesive, and aligning the flexible coverlay under an upper patterned screen, where the upper patterned screen includes a number of first areas corresponding to the number of P-designated contact holes and the number of N-designated contact holes, and a number of second areas corresponding to a number of upper electrically conductive leads.

Further, the method includes screen printing an upper conduction layer of the flexible thermoelectric device on top of and through the flexible coverlay by pressing a conductive paste through the upper patterned screen such that the conductive paste penetrates the each P-designated contact hole to form an electrically conductive contact coupled to the top of a corresponding one P-type conduit, the conductive paste penetrates the each N-designated contact hole to form another electrically conductive contact coupled to the top of a corresponding one N-type conduit, and the conductive paste at each second area forms an upper electrically conductive lead connecting a pair of electrically conductive contacts. The number of P-type conduits and the number of N-type conduits are electrically connected in series.

In another aspect, a method of producing a flexible thermoelectric device includes drilling a number of P-designated contact holes through a flexible coverlay each corresponding to a P-type conduit of a number of P-type conduits directly on top of a lower conduction layer of the flexible thermoelectric device, and a number of N-designated contact holes through the flexible coverlay each corresponding to an N-type conduit of a number of N-type conduits directly on top of the lower conduction layer, and aligning the number of P-type conduits and the number of N-type conduits under the flexible coverlay such that the each P-designated contact hole of the flexible coverlay is directly above one of the P-type conduits and the each N-designated contact hole of the flexible coverlay is directly above one of the N-type conduits. The flexible coverlay includes a layer of adhesive under an internal dielectric layer.

Each P-type conduit is electrically connected to one of the N-type conduits through the lower conduction layer directly above a lower dielectric layer of the flexible thermoelectric device. The method also includes laminating the flexible coverlay on top of the lower conduction layer by pressing the flexible coverlay against the lower conduction layer such that the layer of adhesive deforms and fills a space around the each of the P-type conduits and each of the N-type conduits, and the flexible coverlay is attached to the lower conduction layer through the layer of adhesive, and aligning the flexible coverlay under an upper patterned screen, where the upper patterned screen includes a number of first areas corresponding to the number of P-designated contact holes and the number of N-designated contact holes, and a number of second areas corresponding to a number of upper electrically conductive leads.

Further, the method includes screen printing an upper conduction layer of the flexible thermoelectric device on top of and through the flexible coverlay by pressing a conductive paste through the upper patterned screen such that the conductive paste penetrates the each P-designated contact hole to form an electrically conductive contact coupled to the top of a corresponding one P-type conduit, the conductive paste penetrates the each N-designated contact hole to form another electrically conductive contact coupled to the top of a corresponding one N-type conduit, and the conductive paste at each second area forms an upper electrically conductive lead connecting a pair of electrically conductive contacts, and thermally insulating the each of the number of P-type conduits and the each of the number of N-type conduits so that a heat energy flows vertically through the conduit without leaking to other conduits on the sides. The number of P-type conduits and the number of N-type conduits are electrically connected in series.

In yet another aspect, a method of producing a flexible thermoelectric device includes drilling a number of P-designated contact holes through a flexible coverlay each corresponding to a P-type conduit of a number of P-type conduits directly on top of a lower conduction layer of the flexible thermoelectric device, and a number of N-designated contact holes through the flexible coverlay each corresponding to an N-type conduit of a number of N-type conduits directly on top of the lower conduction layer, and aligning the number of P-type conduits and the number of N-type conduits under the flexible coverlay such that the each P-designated contact hole of the flexible coverlay is directly above one of the P-type conduits and the each N-designated contact hole of the flexible coverlay is directly above one of the N-type conduits. The flexible coverlay includes a layer of adhesive under an internal dielectric layer.

Each P-type conduit is electrically connected to one of the N-type conduits through the lower conduction layer directly above a lower dielectric layer of the flexible thermoelectric device. The method also includes laminating the flexible coverlay on top of the lower conduction layer by pressing the flexible coverlay against the lower conduction layer such that the layer of adhesive deforms and fills a space around the each of the P-type conduits and each of the N-type conduits, and the flexible coverlay is attached to the lower conduction layer through the layer of adhesive, and aligning the flexible coverlay under an upper patterned screen, where the upper patterned screen includes a number of first areas corresponding to the number of P-designated contact holes and the number of N-designated contact holes, and a number of second areas corresponding to a number of upper electrically conductive leads.

Further, the method includes screen printing an upper conduction layer of the flexible thermoelectric device on top of and through the flexible coverlay by pressing a conductive paste through the upper patterned screen such that the conductive paste penetrates the each P-designated contact hole to form an electrically conductive contact coupled to the top of a corresponding one P-type conduit, the conductive paste penetrates the each N-designated contact hole to form another electrically conductive contact coupled to the top of a corresponding one N-type conduit, and the conductive paste at each second area forms an upper electrically conductive lead connecting a pair of electrically conductive contacts, thermally insulating the each of the number of P-type conduits and the each of the number of N-type conduits so that a heat energy flows vertically through the conduit without leaking to other conduits on the sides, and sealing and protecting the flexible thermoelectric device with an upper dielectric layer. The number of P-type conduits and the number of N-type conduits are electrically connected in series.

The methods and devices disclosed herein may be implemented in any means for achieving various aspects. Other features will be apparent from the accompanying drawings and from the detailed description that follows.

BRIEF DESCRIPTION OF THE DRAWINGS

The embodiments of this invention are illustrated by way of example and not limitation in the Figures of the accompanying drawings, in which like references indicate similar elements and in which.

Figure 1:
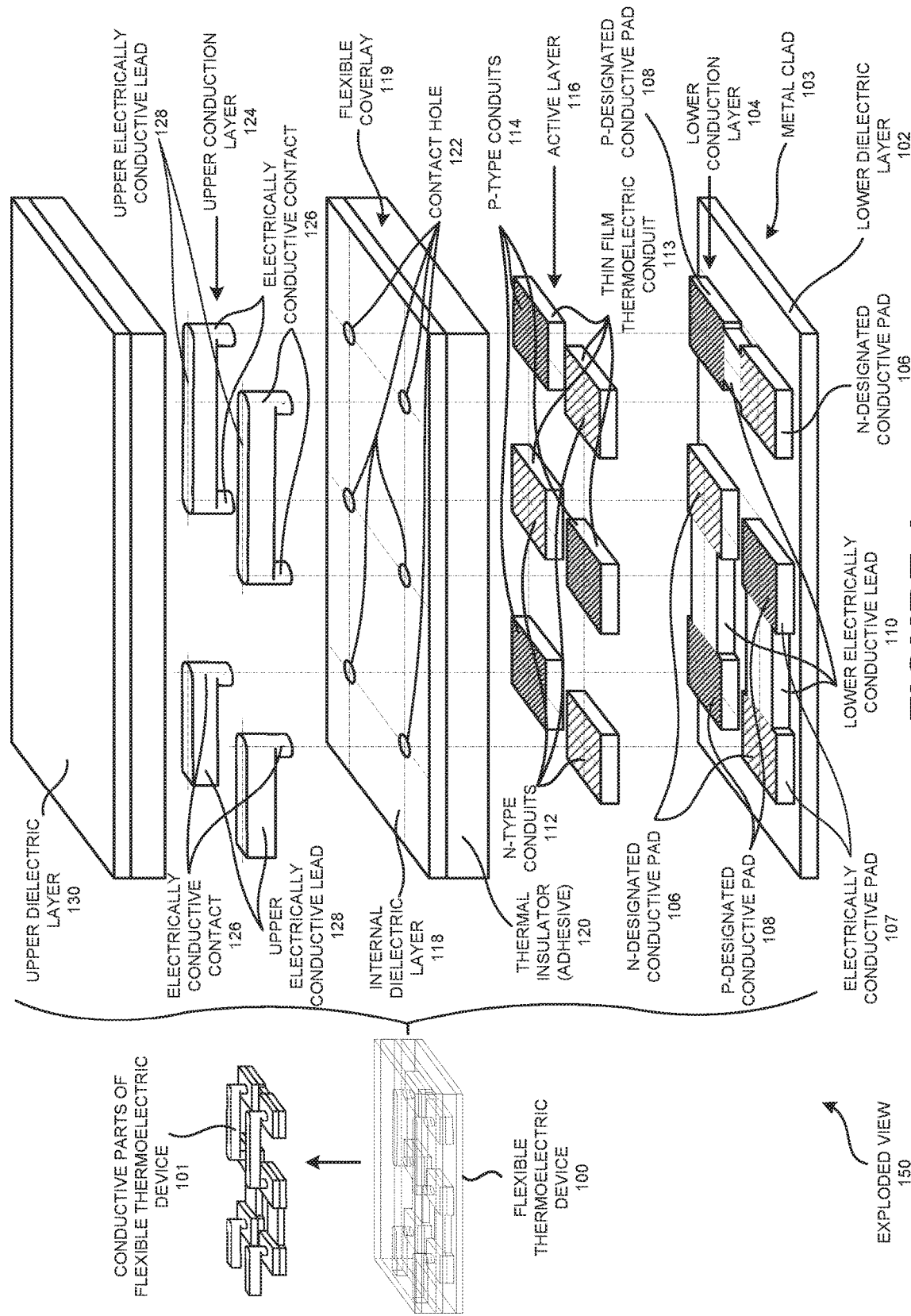
FIG. 1 is an exploded view of a flexible thermoelectric device illustrating an active layer of thin film thermoelectric conduits between a lower conduction layer and an upper conduction layer interleaved with a lower dielectric layer, an internal dielectric layer and an upper dielectric layer, according to one embodiment.

Other features of the present embodiments will be apparent from the accompanying drawings and from the detailed description that follows.

DETAILED DESCRIPTION

Example embodiments, as described below, may be used to provide a method of producing a flexible thermoelectric device to harvest energy for wearable applications. Although the present embodiments have been described with reference to specific example embodiments, it will be evident that various modifications and changes may be made to these embodiments without departing from the broader spirit and scope of the various embodiments.

In one embodiment, a method of producing a flexible thermoelectric device 100 includes forming a lower conduction layer 104 on top of a lower dielectric layer 102, with the lower conduction layer 104 including a plurality of electrically conductive pads 107 and a plurality of lower electrically conductive leads 110. The plurality of electrically conductive pads 107 includes a plurality of N-designated conductive pads 106 and a plurality of P-designated conductive pads 108. Each of the lower electrically conductive leads 110 connects a pair of neighboring N-designated conductive pad 106 and P-designated conductive pad 108.

The method includes aligning an N-designated mask 600 on top of the lower conduction layer 104. The N-designated mask 600 has a first pattern based on the plurality of N-designated conductive pads 106 of the lower conduction layer 104. The plurality of N-designated conductive pads 106 of the lower conduction layer 104 is exposed through the N-designated mask 600. A plurality of N-type conduits 112 each on top of one of the N-designated conductive pads 106 exposed through the N-designated mask 600 is formed based on the first pattern.

A P-designated mask 500 is aligned on top of the lower conduction layer 104. The P-designated mask 500 has a second pattern based on the plurality of P-designated conductive pads 108 of the lower conduction layer 104. The plurality of P-designated conductive pads 108 of the lower conduction layer 104 is exposed through the P-designated mask 500. A plurality of P-type conduits 114 each on top of one of the P-designated conductive pads 108 exposed through the P-designated mask 500 is formed based on the second pattern.

The method further includes laminating a layer of thermal insulator 120 on top of and around the plurality of N-type conduits 112 and/or the P-type conduits 114 such that the thermal insulator 120 fills a space around each of the N-type conduits 112 and/or P-type conduits 114, with an internal dielectric layer 118 on top of the layer of thermal insulator 120. A plurality of contact holes 122 each through the internal dielectric layer 118 and the layer of thermal insulator 120 above one of the N-type conduits 112 and/or P-type conduits 114 are drilled.

The method also includes forming an upper conduction layer 124 on top of the internal dielectric layer 118 and/or through the plurality of contact holes 122. The upper conduction layer 124 includes a plurality of electrically conductive contacts 126 and/or a plurality of upper electrically conductive leads 128. Each of the electrically conductive contacts 126 is coupled to the top of one of the N-type conduits 112 and P-type conduits 114 through one of the contact holes 122. Each of the upper electrically conductive leads 128 connects a pair of neighboring electrically conductive contacts 126. An upper dielectric layer 130 is formed on top of the upper conduction layer 124.

A portion of each of the electrically conductive contacts 126 is located between the internal dielectric layer 118 and the upper dielectric layer 130. Each of the N-type conduits 112 and P-type conduits 114 is a thin film thermoelectric conduit 113. Each of the N-type conduits 112 contains one or more N-type thermoelectric material 200. Each of the P-type conduits 114 contains one or more P-type thermoelectric material 202.

Each of the N-type conduits 112 is (1) electrically connected to one of the P-type conduits 114 through an N-designated conductive pad 106, a lower electrically conductive lead 110, and a P-designated conductive pad 108 in the lower conduction layer 104, and (2) electrically connected to another one of the P-type conduits 114 through two electrically conductive contacts 126 coupled to the top of the two conduits and an upper electrically conductive lead 128 connecting the two electrically conductive contacts 126 in the upper conduction layer 124. Similarly, each of the P-type conduits 114 is (1) electrically connected to one of the N-type conduits 112 through a P-designated conductive pad 108, a lower electrically conductive lead 110, and an N-designated conductive pad 106 in the lower conduction layer 104, and (2) electrically connected to another one of the N-type conduits 112 through two electrically conductive contacts 126 coupled to the top of the two conduits (e.g., N-type conduits 112, P-type conduits 114) and an upper electrically conductive lead 128 connecting the two electrically conductively contacts 126 in the upper conduction layer 124. The plurality of N-type conduits 112 and P-type conduits 114 are electrically connected in series.

Each of the N-type conduits 112 and/or P-type conduits 114 is thermally insulated so that a heat energy flows vertically through the thin film thermoelectric conduit 113 without leaking to other thin film thermoelectric conduits 113 on the sides.

Each dielectric layer may have a thermal conductivity value. The internal dielectric layer 118 may be an electrical insulator and/or a poor thermal conductor having the thermal conductivity value less than 1 watt per meter kelvin (W/(mK)). Both the upper dielectric layer 130 and the lower dielectric layer 102 may be electrical insulators and/or good thermal conductors having the thermal conductivity value greater than 5 watts per meter kelvin (W/(mK)).

The thin film thermoelectric conduits 113 may include one or more layer of thermoelectric material with a combined thickness no greater than 50 microns.

A barrier layer 300A-300C may be formed through the N-designated mask 600, the P-designated mask 500, and/or a PN-designated mask 700 with one or more of the N-designated conductive pads 106 and/or P-designated conductive pads 108 exposed.

The barrier layer 300A-300C may be between (1) different layers of thermoelectric material (e.g. 200 and/or 202) within one or more thin film thermoelectric conduit 113, (2) an electrically conductive pad 107 and a second thin film thermoelectric conduit 113, and/or (3) an electrically conductive contact 126 and a third thin film thermoelectric conduit 113. The barrier layer 300A-300C may be electrically conductive and may have a higher melting temperature than either of the substances being separated by the barrier layer 300A-300C.

The forming of the lower conduction layer 104, the forming of the N-type conduits 112, the forming of the P-type conduits 114, the forming of the upper conduction layer 124. and/or the forming of the upper dielectric layer 130 may comprise a vacuum deposition, a sputter deposition, a chemical vapor deposition, a physical vapor deposition, an electrochemical deposition, a molecular beam epitaxy, an atomic layer deposition, an electroplating, a screen printing, an etching, a chemical-mechanical planarization, a lithography, another deposition method and/or an etching method.

The lower dielectric layer 102, the internal dielectric layer 118, and/or the upper dielectric layer 130 may be a flexible polymer, a polymer composite, a polyimide, a polyacrylate, a polyvinyl acetate and/or a mylar. The plurality of electrically conductive pads 107 may be formed from a first layer of metal 402 in a first metal clad 103, a first layer of deposited metal, a first layer of conductive paste (e.g., conductive paste 304), a first electroplated layer, and/or a first surface plating layer 302. The plurality of electrically conductive contacts 126 may be formed from a second layer of metal 402 in a second metal clad 103, a second layer of deposited metal, a second layer of conductive paste (e.g., conductive paste 304), a second electroplated layer, and/or a second surface plating layer 302.

The lower conduction layer 104 together with the plurality of N-type conduits 112 and/or the plurality of P-type conduits 114 may be annealed before the upper conduction layer 124 is made.

The aligning of the N-designated mask 600, the forming of the N-type conduits 112, the aligning of the P-designated mask 500, and the forming of the P-type conduits 114, may all be accomplished within the same vacuum system while continuing to maintain a vacuum.

In another embodiment, a method of producing a flexible thermoelectric device 100 includes aligning a lower patterned mask 400 on top of a flexible metal clad 103. The lower patterned mask 400 includes a plurality of first areas corresponding to a plurality of electrically conductive pads 107 and a plurality of lower electrically conductive leads 110. The flexible metal clad 103 includes a layer of metal 402 on top of a lower dielectric layer 102. The plurality of electrically conductive pads 107 includes a plurality of P-designated conductive pads 108 and a plurality of N-designated conductive pads 106. Each of the lower electrically conductive leads 110 links a pair of P-designated conductive pad 108 and N-designated conductive pad 106.

The method includes forming a lower conduction layer 104 of the flexible thermoelectric device 100 with the lower conduction layer containing the plurality of P-designated conductive pads 108, the plurality of N-designated conductive pads 106 and/or the plurality of lower electrically conductive leads 110. The lower conduction layer 104 is formed based on the lower patterned mask 400 using the layer of metal 402 of the flexible metal clad 103 by removing a metal outside the plurality of first areas using the lower patterned mask 400.

A P-designated mask 500 is aligned on top of the lower conduction layer 104 of the flexible metal clad 103. The P-designated mask 500 has a first pattern corresponding to the plurality of P-designated conductive pads 108 of the lower conduction layer 104. The plurality of P-designated conductive pads 108 is exposed through the P-designated mask 500.

The method also includes forming a plurality of P-type conduits 114 with one or more layer of P-type thermoelectric material 202 using the P-designated mask 500 and one or more kind of the P-type thermoelectric material 202. Each of the P-type conduits 114 is located on top of one of the P-designated conductive pads 108 of the flexible metal clad 103 exposed through the P-designated mask 500.

An N-designated mask 600 is aligned on top of the lower conduction layer 104 of the flexible metal clad 103. The N-designated mask 600 has a second pattern corresponding to the plurality of N-designated conductive pads 106 of the lower conduction layer 104. The plurality of N-designated conductive pads 106 is exposed through the N-designated mask 600. A plurality of N-type conduits 112 is formed with one or more layer of N-type thermoelectric material 200 using the N-designated mask 600 and one or more kind of N-type thermoelectric material 200. Each of the N-type conduits 112 is located on top of one of the N-designated conductive pads 106 of the flexible metal clad 103 exposed through the N-designated mask 600.

The method further includes drilling a plurality of P-designated contact holes (e.g., contact holes 122) through a flexible coverlay 119 each corresponding to one of the P-type conduits 114 and a plurality of N-designated contact holes (e.g., contact holes 122) through the flexible coverlay 119 each corresponding to one of the N-type conduits 112. The flexible coverlay 119 includes an internal dielectric layer 118 on top of a layer of adhesive (e.g., thermal insulator (adhesive) 120). The plurality of P-type conduits 114 and N-type conduits 112 of the lower conduction layer 104 is aligned under the flexible coverlay 119. Each of the P-designated contact holes (e.g., contact holes 122) of the flexible coverlay 119 is directly above one of the P-type conduits 114 and each of the N-designated contact holes (e.g., contact holes 122) of the flexible coverlay 119 is directly above one of the N-type conduits 112.

The flexible coverlay 119 is laminated on top of the lower conduction layer 104 by pressing the flexible coverlay 119 against the lower conduction layer 104 under controlled conditions. The layer of adhesive (e.g., thermal insulator (adhesive) 120) deforms and fills a space around each of the P-type conduits 114 and/or N-type conduits 112. The flexible coverlay 119 is attached to the flexible metal clad 103 through the layer of adhesive (e.g., thermal insulator (adhesive) 120). The flexible coverlay 119 is aligned under an upper patterned mask 900. The upper patterned mask 900 has a plurality of second areas corresponding to the plurality of P-designated contact holes (e.g., contact holes 122) and N-designated contact holes (e.g., contact holes 122), and a plurality of upper electrically conductive leads 128.

The method also includes forming an upper conduction layer 124 of the flexible thermoelectric device 100 on top of and through the flexible coverlay 119 using the upper patterned mask 900. The upper conduction layer 124 includes a plurality of P-designated electrically conductive contacts (e.g., electrically conductive contacts 126) each in one of the P-designated contact holes (e.g., contact holes 122) coupled to the top of one of the P-type conduits 114 and a plurality of N-designated electrically conductive contacts (e.g., electrically conductive contacts 126) each in one of the N-designated contact holes (e.g., contact holes 122) coupled to the top of one of the N-type conduits 112. The upper conduction layer 124 further includes the plurality of upper electrically conductive leads 128 each connecting a pair of P-designated electrically conductive contact (e.g., electrically conductive contacts 126) and N-designated electrically conductive contact (e.g., electrically conductive contacts 126).

The method includes sealing and protecting the flexible thermoelectric device 100 with an upper dielectric layer 130. Each of the N-type conduits 112 is electrically connected to one of the P-type conduits 114 in the lower conduction layer 104 and to another one of the P-type conduits 114 in the upper conduction layer 124. Each of the P-type conduits 114 is electrically connected to one of the N-type conduits 112 in the lower conduction layer 104 and to another one of the N-type conduits 112 in the upper conduction layer 124. The plurality of P-type conduits 114 and N-type conduits 112 are electrically connected in series. Each of the P-type conduits 114 and N-type conduits 112 is thermally insulated. A heat energy flows vertically through the conduit without leaking to other conduits on the sides.

A PN-designated mask 700 may be aligned above the lower conduction layer 104 of the flexible metal clad 103. The PN-designated mask 700 may have a third pattern corresponding to the plurality of P-designated conductive pads 108 and/or N-designated conductive pads 106. At least one of the P-designated conductive pads 108 and/or N-designated conductive pads 106 may be exposed through the PN-designated mask 700.

A soft mask may be used for the lower patterned mask 400, the P-designated mask 500, the N-designated mask 600 and/or the upper patterned mask 900. A layer of photo-resist may be applied to the flexible metal clad 103, the lower conduction layer 104, the plurality of P-type conduits 114, the plurality of N-type conduits 112, the flexible coverlay 119, and/or the upper conduction layer 124 of the flexible thermoelectric device 100. The flexible metal clad 103 of the flexible thermoelectric device 100 may be aligned with a photo mask. The photo mask may have a fourth pattern corresponding to the lower patterned mask 400, the P-designated mask 500, the N-designated mask 600 and/or the upper patterned mask 900. A light from a light source behind the photo mask may be partially blocked by the photo mask according to the fourth pattern on the photo mask.

The flexible metal clad 103, the lower conduction layer 104, the plurality of P-type conduits 114, the plurality of N-type conduits 112, the flexible coverlay 119, and/or the upper conduction layer 124 of the flexible thermoelectric device 100, and the layer of photo-resist may be exposed to the light from the light source through the photo mask.

The method may perform forming a layer of P-type thermoelectric material 202, N-type thermoelectric material 200, metal and/or dielectric on the flexible thermoelectric device 100 according to the fourth pattern on the photo mask. The method may further perform etching the layer of P-type thermoelectric material 202, N-type thermoelectric material 200, metal and/or dielectric on the flexible thermoelectric device 100 according to the fourth pattern on the photo mask. Any remaining photo-resist may be removed.

A hard mask may be used for the lower patterned mask 400, the P-designated mask 500, the N-designated mask 600 and/or the upper patterned mask 900. The lower patterned mask 400, the P-designated mask 500, the N-designated mask 600 and/or the upper patterned mask 900 may be a stencil. An electroless nickel immersion gold (ENIG) process may be applied to surface plate a layer of nickel and/or a layer of gold over the layer of metal 402 of the flexible metal clad 103. The method may further include cleaning and rinsing with a deionized water.

In yet another embodiment, a method of producing a flexible thermoelectric device 100 includes drilling a plurality of P-designated contact holes (e.g., contact holes 122) through a flexible coverlay 119 each corresponding to a P-type conduit 114 on top of a lower conduction layer 104 of the flexible thermoelectric device 100, and a plurality of N-designated contact holes (e.g., contact holes 122) through the flexible coverlay 119 each corresponding to an N-type conduit 112 on top of the lower conduction layer 104. The flexible coverlay 119 includes a layer of adhesive (e.g., thermal insulator (adhesive) 120) under an internal dielectric layer 118. The plurality of P-type conduits 114 and N-type conduits 112 is aligned under the flexible coverlay 119. Each of the P-designated contact holes (e.g., contact holes 122) of the flexible coverlay 119 is directly above one of the P-type conduits 114 and each of the N-designated contact holes (e.g., contact holes 122) of the flexible coverlay 119 is directly above one of the N-type conduits 112.

Each of the P-type conduits 114 is electrically connected to one of the N-type conduits 112 through a P-designated conductive pad 108 and an N-designated conductive pad 106 connected by a lower electrically conductive lead 110 in the lower conduction layer 104 above a lower dielectric layer 102 of the flexible thermoelectric device 100.

The flexible coverlay 119 is laminated on top of the lower conduction layer 104 by pressing the flexible coverlay 119 against the lower conduction layer 104 under controlled conditions. The layer of adhesive (e.g., thermal insulator (adhesive) 120) deforms and fills a space around each of the P-type conduits 114 and/or N-type conduits 112. The flexible coverlay 119 is attached to the lower conduction layer 104 through the layer of adhesive (e.g., thermal insulator (adhesive) 120).

The method further includes aligning the flexible coverlay 119 under an upper patterned screen (e.g., upper patterned mask 900). The upper patterned screen (e.g., upper patterned mask 900) includes a plurality of first areas corresponding to the plurality of P-designated contact holes (e.g., contact holes 122) and N-designated contact holes (e.g., contact holes 122), and a plurality of second areas corresponding to a plurality of upper electrically conductive leads 128. The method also includes screen printing an upper conduction layer 124 of the flexible thermoelectric device 100 on top of and through the flexible coverlay 119 by pressing a conductive paste 304 through the upper patterned screen (e.g., upper patterned mask 900).

The conductive paste 304 penetrates each P-designated contact hole (e.g. contact hole 122) to form an electrically conductive contact 126 coupled to the top of one of the P-type conduits 114. The conductive paste 304 penetrates each N-designated contact hole (e.g. contact hole 122) to form another electrically conductive contact 126 coupled to the top of one of the N-type conduits 112. The conductive paste 304 at each of the second areas forms an upper electrically conductive lead 128 connecting a pair of electrically conductive contacts 126.

The method includes sealing and protecting the flexible thermoelectric device 100 with an upper dielectric layer 130. The plurality of P-type conduits 114 and N-type conduits 112 are electrically connected in series. Each of the P-type conduits 114 and N-type conduits 112 is thermally insulated. A heat energy flows vertically through the conduit without leaking to other conduits on the sides.

FIG. 1 is an exploded view 150 of a flexible thermoelectric device 100 illustrating an active layer 116 of thin film thermoelectric conduits 113 between a lower conduction layer 104 and an upper conduction layer 124 interleaved with a lower dielectric layer 102, an internal dielectric layer 118 and an upper dielectric layer 130, according to one embodiment.

In one embodiment, a system of the flexible thermoelectric device 100 with conductive parts of flexible thermoelectric device 101 may include a lower dielectric layer 102, a lower conduction layer 104 with a lower electrically conductive lead 110 and an electrically conductive pad 107 which may be an N-designated conductive pad 106 or a P-designated conductive pad 108, an active layer 116 with a thin film thermoelectric conduit 113 which may be a P-type conduits 114 or an N-type conduit 112, a flexible coverlay 119 with an internal dielectric layer 118 and a thermal insulator (adhesive) 120 and a contact hole 122 drilled through the flexible coverlay 119, and an upper conduction layer 124 with an electrically conductive contact 126, an upper electrically conductive lead 128, and an upper dielectric layer 130, according to one embodiment.

The flexible thermoelectric device 100 may be a flexible device which converts heat (i.e. a temperature differential) directly into electrical energy. Furthermore, applying a current to a thermoelectric device may create a temperature differential, which may be used to heat and/or cool a surface.

The conductive parts of flexible thermoelectric device 101 may include the upper conduction layer 124, the active layer 116, and the lower conduction layer 104 with the N-type conduits 112 and P-type conduits 114 connected in series. The conductive parts of flexible thermoelectric device 101 functions as an electrical conduction path 1300 such that an electrical energy flows in a zig-zag manner through the conductive parts of flexible thermoelectric device 101. Overall, the electrical energy flows in a "horizontal" manner.

The lower dielectric layer 102 may be a flexible dielectric material which provides structure to the flexible thermoelectric device 100. In an example embodiment, the lower dielectric layer 102 may be both electrical insulator and good thermal conductor having a thermal conductivity value greater than 5 watts per meter kelvin (W/(mK)).

In various embodiments, the lower dielectric layer 102 may be a flexible polymer material which has a high thermal conductivity, and is also electrically insulating. Examples of flexible polymer material may include, but are not limited to, polyimide which has been doped to increase thermal conductivity. In some embodiments, the lower dielectric layer 102 may be between 1 millimeter and 10 millimeters thick. The lower dielectric layer 102 may also be metal-clad, such as copper-clad Kapton tape. The lower dielectric layer 102 should be chosen such that it will not melt at the temperatures associated with the production of the flexible thermoelectric device 100 (e.g. the high temperatures associated with sputter deposition, etc.).

The metal clad 103 may be a composite of two or more dissimilar metals, metallurgically bonded together, to achieve improved functional characteristics. The metal clad 103 may also be a layer of metal 402 on top of a layer of dielectric. The layer of metal 402 and the layer of dielectric (e.g., lower dielectric layer 102) may be bonded together.

The plurality of electrically conductive pads 107 may be formed from a layer of metal 402 in a metal clad 103. The process of metal cladding may include metallic electroplating applied to a polymer sheet. Examples include of metal clad 103 may include, but are not limited to, copper-clad Kapton tape. In some embodiments, the metal cladding may be removed from the polymer sheet using resist and an etchant.

The lower conduction layer 104 may include the plurality of electrically conductive pads 107 and a plurality of lower electrically conductive leads 110. A pair of neighboring N-type conduit 112 and P-type conduit 114 may be electrically connected via an N-designated conductive pad 106 and a P-designated conductive pad 108 connected by a lower electrically conductive lead 110 in the lower conduction layer 104.

The N-designated conductive pad 106 may be a conductive pad in the lower conduction layer 104 to connect an N-type conduit 112 in series with a neighboring P-type conduit 114 through a lower electrically conductive lead 110 and a P-designated conductive pad 108.

The electrically conductive pad 107 may be a flat area which may be affixed to a material or component, or to which a material or component may be affixed to make an electrical connection. The plurality of electrically conductive pad 107 may include a plurality of N-designated conductive pads 106 and a plurality of P-designated conductive pads 108.

The P-designated conductive pad 108 may be a conductive pad in the lower conduction layer 104 to connect a P-type conduit 114 in series with a neighboring N-type conduit 112 through a lower electrically conductive lead 110 and an N-designated conductive pad 106.

In some embodiments, these two types (e.g., P-designated and N-designated) of pads may possess identical materials and properties. They may differ in appearance to aid in device construction and testing. For example, in one embodiment, the N-designated conductive pads 106 and P-designated conductive pads 108 may simply be given different shapes to indicate the material type designation.

In other embodiments, however, these two pad types may differ in more substantial ways. For example, in one embodiment, the N-designated conductive pads 106 and P-designated conductive pads 108 may be composed of different conductive materials which are optimized for the N-type conduits 112 and P-type conduits 114 to be formed upon them (e.g. have a similar crystal structure, etc.). In such an embodiment, the N-designated conductive pads 106 and the P-designated conductive pads 108 may be created using N-designated masks 600 and P-designated masks 500, and may be affixed to interconnected conductive pads (e.g., N-designated conductive pads 106, P-designated conductive pads 108).

The lower electrically conductive lead 110 may be a conducting material which connects two points of a circuit together in the lower conduction layer 104. In one embodiment, the lower electrically conductive lead 110 may be a conducting material (e.g. etched cladding, vacuum deposition, surface plating, electroplating, etc.) applied directly to the surface of the lower conduction layer 104. In another embodiment, the lower electrically conductive lead 110 may be a wire. The lower electrically conductive lead 110 may connect a pair of neighboring N-designated conductive pad 106 and P-designated conductive pad 108.

The N-type conduits 112 may be a layer and/or a stack of layers of materials within the flexible thermoelectric device 100. The materials may include, at least in part, one or more N-type thermoelectric material(s) 200 in which the primary charge carrier is electrons. According to various embodiments, an N-type conduit 112 may include thin film N-type thermoelectric materials 200, conductive materials, barrier layers (300A, 300B, 300C), and/or conductive adhesive layers (e.g., conductive paste 304).

The thin film thermoelectric conduit 113 may be a layer of thermoelectric material and/or a stack of layered materials which comprise thermoelectric materials. In one embodiment, some or all of these layers may be formed or deposited as a thin film, whose thickness may range from sub-nanometer to micrometers.

The lower conduction layer 104 and the upper conduction layer 124 may be layers within the flexible thermoelectric device 100 which are comprised of electrically conductive material electrically coupled to the thin film thermoelectric conduits 113. In various embodiments, the thin film thermoelectric conduit 113 may be incorporated into the flexible thermoelectric device 100 in such a way that it serves as a conduit for heat from one side of the device to the other.

In an example embodiment, each of the N-type conduits 112 may be a thin film thermoelectric conduit 113 that includes an N-type thermoelectric material 200. In another example embodiment, each of the P-type conduits 114 may be a thin film thermoelectric conduit 113 that includes a P-type thermoelectric material 202.

The P-type conduits 114 may be a layer or a stack of layers of materials within the flexible thermoelectric device 100 which is comprised, at least in part, of one or more P-type thermoelectric materials 202 in which the primary charge carrier is positive holes. According to various embodiments, a P-type conduit 114 may comprise thin film P-type thermoelectric materials 202, conductive materials, barrier layers (300A, 300B, 300C), and/or conductive adhesive layers.

The active layer 116 may be a portion of the flexible thermoelectric device 100 which comprises thermoelectric materials (e.g., P-type thermoelectric materials 202, N-type thermoelectric material 200). In some embodiments, the active layer 116 may further comprise materials and/or components which are not thermoelectric or electrically conductive. The active layer 116 may be the surface and/or coating of thin film thermoelectric conduit 113 between a lower conduction layer 104 and an upper conduction layer 124 of the flexible thermoelectric device 100.

The internal dielectric layer 118 may be a flexible dielectric material which has poor thermal conductivity and is also electrically insulating. Examples include, but are not limited to, Teflon. The internal dielectric layer 118 may be an electrical insulator and a poor thermal conductor having a thermal conductivity value less than 1 watts per meter kelvin (W/(mK)).

The flexible coverlay 119 may be a material laminated to the outside layers of the circuit to insulate the copper conductor. The flexible coverlay 119 may include an internal dielectric layer 118 on top of a layer of adhesive (e.g., thermal insulator (adhesive) 120). The flexible coverlay 119 serves as a solder resist for flexible printed circuit boards. Conventional soldermasks have only a limited bendability, so for flex-circuits that require greater bendability, the flexible coverlay 119 may be glued on to protect the copper structure. The flexible coverlay 119 may have a layer of glue and a layer of dielectric (Adhesive+dielectric).

The thermal insulator (adhesive) 120 may be a material which reduces the conduction of thermal energy. In the context of the present description, the thermal insulator (adhesive) 120 may also be electrically insulating. The thermal insulator (adhesive) 120 may be a cross-linked polymer adhesive, such as prepeg or other resins with similar properties.

The contact hole 122 may be a passage created through material which separates the upper electrically conductive leads 128 of the upper conduction layer 124 and the thin film thermoelectric conduits 113 of the active layer 116. Specifically, the contact hole 122 may be a passage through the thermal insulator (adhesive) 120 and/or the internal dielectric layer 118 which are on top of a thin film thermoelectric conduit 113. In various embodiments, the contact hole 122 may be formed by drilling through the material above a thin film thermoelectric conduit 113, either mechanically or using a laser.

The upper conduction layer 124 may be a layer within the flexible thermoelectric device 100 comprised of electrically conductive material electrically coupled to the thin film thermoelectric conduits 113. The upper conduction layer 124 may be formed on top of the internal dielectric layer 118 and through the plurality of contact holes 122 including a plurality of electrically conductive contacts 126 and a plurality of upper electrically conductive leads 128. Each of the electrically conductive contacts 126 may be coupled to the top of one of the N-type conduits 112 and P-type conduits 114 through one of the contact holes 122. Each of the upper electrically conductive leads 128 may connect a pair of neighboring electrically conductive contacts 126.

The electrically conductive contact 126 may be a conductive element in electrical contact with a material and/or a component. In some embodiments, the electrically conductive contact 126 may resemble a pin. In other embodiments, the electrically conductive contact 126 may be flat, like an electrically conductive pad 107.

The upper electrically conductive lead 128 may be a conducting material which connects two points of a circuit together in the upper conduction layer 124. In one embodiment, the upper electrically conductive lead 128 may be a conducting material (e.g. etched cladding, vacuum deposition, surface plating, electroplating, etc.) applied directly to the surface of the internal dielectric layer 118. In another embodiment, the lower electrically conductive lead 110 may be a wire. The upper electrically conductive lead 128 may each connect a pair of neighboring electrically conductive contacts 126 in the upper conduction layer 124.

The upper dielectric layer 130 may be formed on the top of the upper conduction layer 124. The upper dielectric layer 130 may be electrical insulator and good thermal conductor having a thermal conductivity value greater than 5 watts per meter kelvin (W/(mK)).

Figure 2:
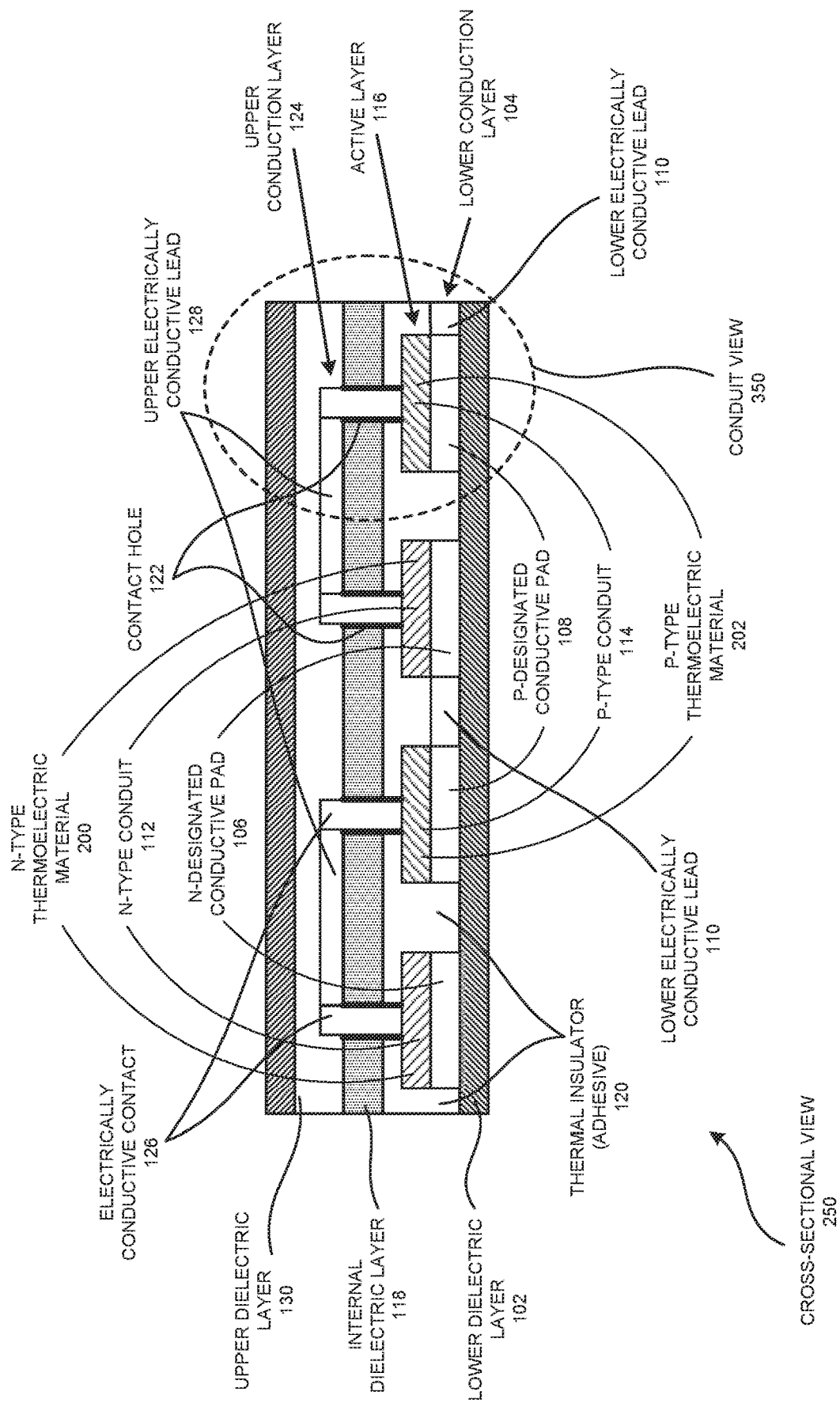
FIG. 2 shows a cross-sectional view of the flexible thermoelectric device of FIG. 1, comprising N-type conduits made of N-type thermoelectric material(s) and P-type conduits made of P-type thermoelectric material(s), according to one embodiment.

FIG. 2 illustrates a cross-sectional view 250 of the flexible thermoelectric device 100 of FIG. 1, comprising N-type conduits 112 made of N-type thermoelectric material(s) 200 and P-type conduits 114 made of P-type thermoelectric material(s) 202, according to one embodiment. Particularly, FIG. 2 builds on FIG. 1, and further adds an N-type thermoelectric material 200 and a P-type thermoelectric material 202.

The N-type thermoelectric material 200 may be a thermoelectric material in which the primary charge carrier is electrons. Plurality of N-type conduits 112 may be formed with one or more layer of N-type thermoelectric material 200 using the N-designated mask 600 and one or more kind of N-type thermoelectric material 200.

The P-type thermoelectric material 202 may be a thermoelectric material in which the primary charge carrier is positive holes. Plurality of P-type conduits 114 may be formed with one or more layer of P-type thermoelectric material 202 using the P-designated mask 500 and one or more kind of P-type thermoelectric material 202.

Each N-type conduit 112 is electrically connected to one neighboring P-type conduit 114 in the lower conduction layer 104 and is electrically connected to another neighboring P-type conduit 114 in the upper conduction layer 124. Similarly, each P-type conduit 114 is electrically connected to one neighboring N-type conduit 112 in the lower conduction layer 104 and is electrically connected to another neighboring N-type conduit 112 in the upper conduction layer 124 such that the N-type conduits 112 and P-type conduits 114 are effectively connected in series.

Figure 3:
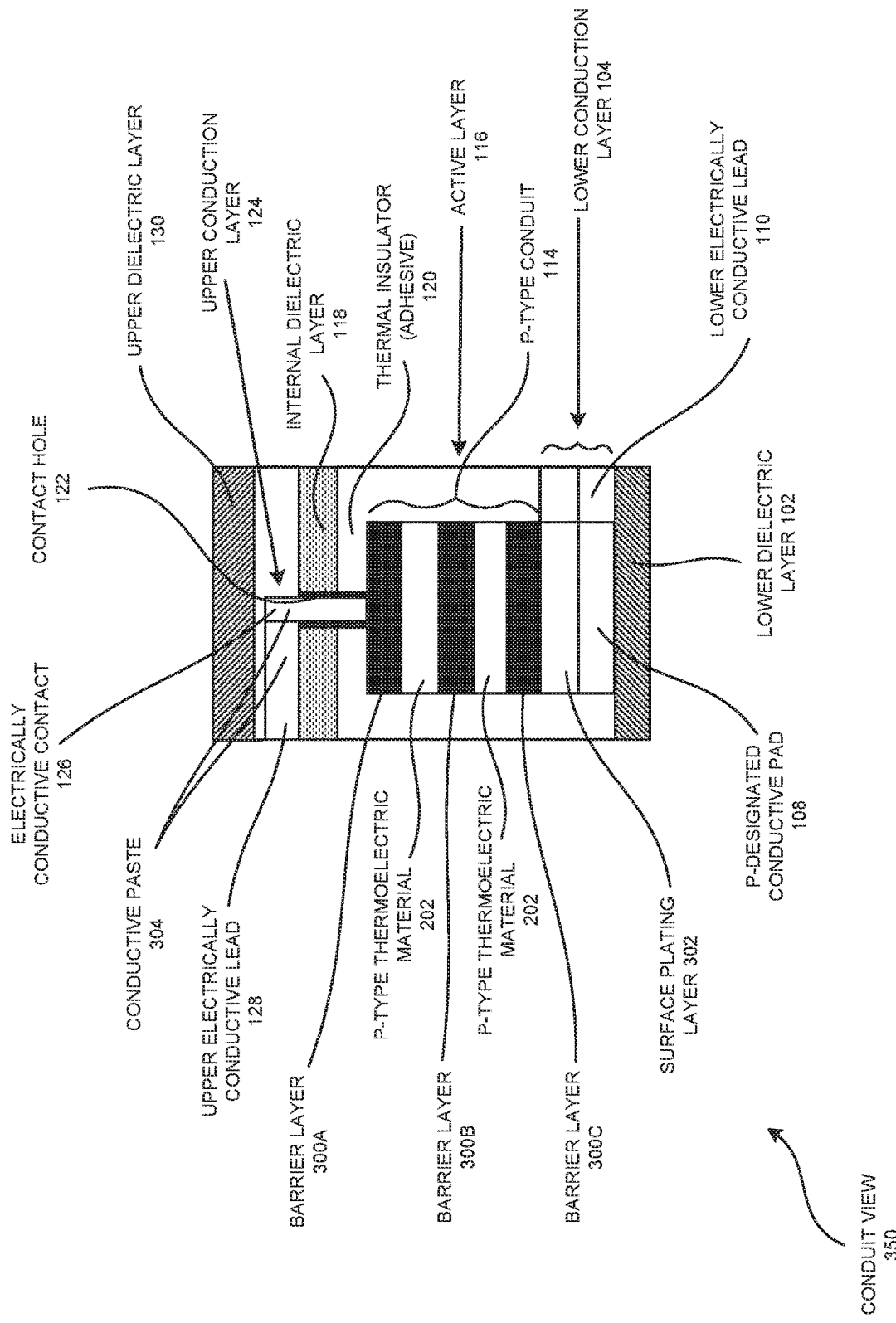
FIG. 3 illustrates a conduit view of the flexible thermoelectric device of FIG. 1, comprising a P-type conduit with more than one layer of thermoelectric material separated by barrier layers, according to one embodiment.

FIG. 3 illustrates a conduit view 350 of the flexible thermoelectric device 100 of FIG. 1, comprising a P-type conduit 114 with more than one layer of thermoelectric material separated by barrier layers 300A, 300B, and 300C, according to one embodiment. Particularly, FIG. 3 builds on FIG. 1, and further adds a barrier layer 300A, 300B and 300C, a surface plating layer 302 and a conductive paste 304.

The barrier layers 300A, 300B, 300C may be a layer of material that prevents the corruption (e.g. diffusion, sublimation, etc.) of one layer by another, according to one embodiment. It may also be known as a diffusion barrier. In many embodiments, a diffusion barrier may be a thin layer (e.g. micrometers thick) of metal sometimes placed between two other metals. It is done to act as a barrier to protect either one of the metals from corrupting the other. Example barrier layer 300A, 300B, 300C materials include, but are not limited to, cobalt, nickel, tungsten, ruthenium, tantalum, tantalum nitride, indium oxide, tungsten nitride, and titanium nitride.

In some embodiments, the barrier layer 300A, 300B, 300C may consist of material with very low thermal conductivity and very high electrical conductivity. Inclusion of a barrier layer 300A, 300B, 300C of this nature may serve to improve the thermoelectric performance by reducing thermal conductivity, which in turn preserves a larger temperature differential, without sacrificing electrical conductivity. In some embodiments, a barrier layer 300A, 300B, 300C may serve as both a diffusion barrier and a thermal barrier. Example barrier layer materials with these properties include, but are not limited to, Indium Antimonide (InSb) and other skutterides, which have low thermal conductivity and high electrical conductivity.

The surface plating layer 302 may be a conductive layer applied to a solid material using a chemical technique. Examples include, but are not limited to, electroless nickel immersion gold (i.e. ENIG), and solder (i.e. HASL, or hot air solder leveling). The surface plating layer 302 may serve as a protective layer of the P-designated conductive pads 108 and the N-designated conductive pads 106 while providing good electrical conductivity.

The conductive paste 304 may be a powdered metal compound suspended in a viscous medium. Examples include, but are not limited to, silver or other conductive ink, silver paste, nano metal ink, and solder paste. The conductive paste 304 may be a liquid metal, such as gallium-containing alloys, with very low melting points which form a eutectic which is liquid at room temperature. In various embodiments, a conductive paste 304 may be applied using a screen printing process, where the paste is applied using a mask or stencil.

Figure 4:
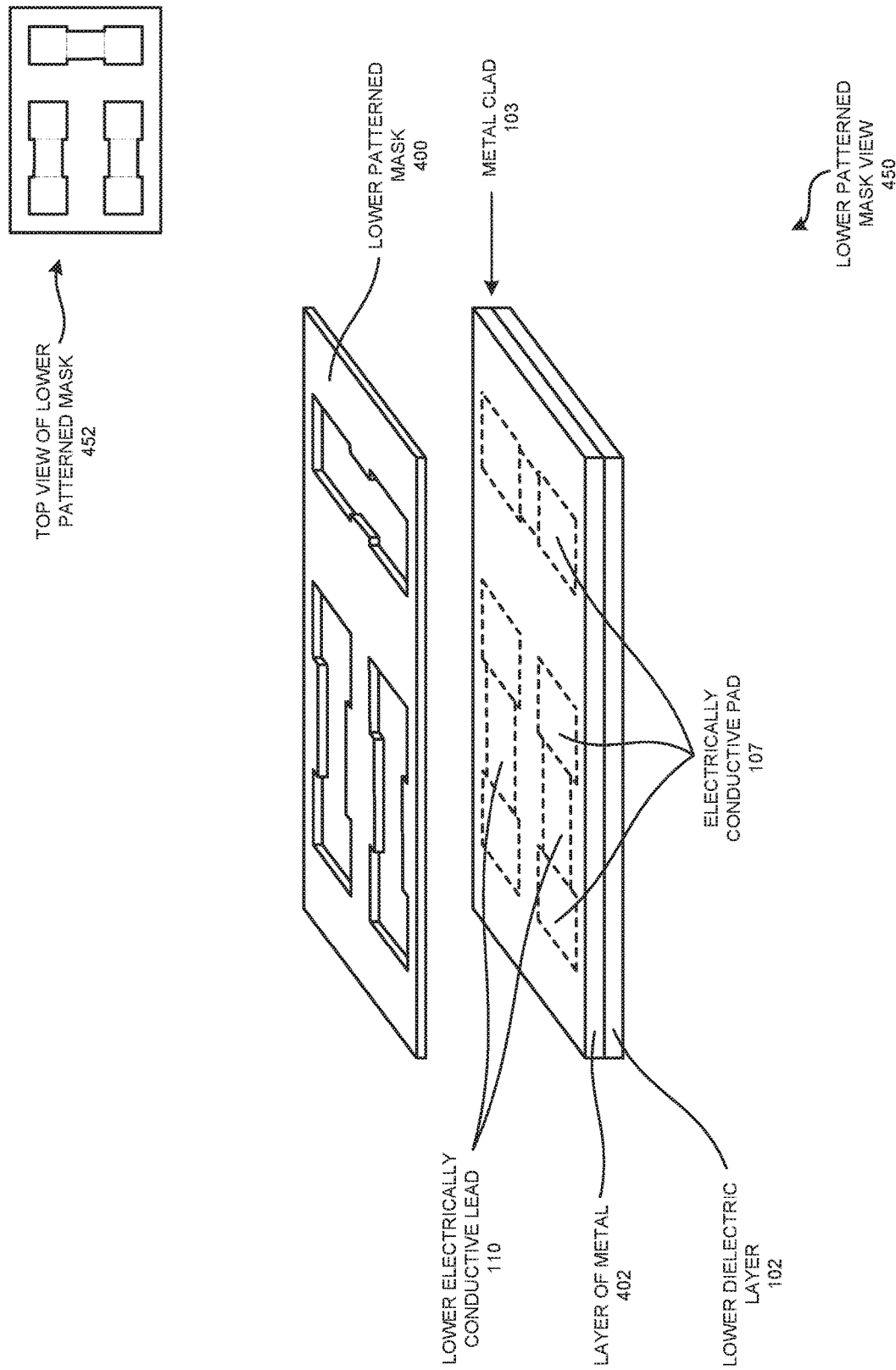
FIG. 4 illustrates a lower patterned mask view of the flexible thermoelectric device of FIG. 1, showing a lower patterned mask aligned on top of a metal clad in preparation for forming a lower conduction layer with electrically conductive pads and lower electrically conductive leads, according to one embodiment.

FIG. 4 is a lower patterned mask view 450 of the flexible thermoelectric device 100 of FIG. 1, illustrating a lower patterned mask 400 aligned on top of a metal clad 103 in preparation for forming a lower conduction layer 104 with electrically conductive pads 107 and lower electrically conductive leads 110, according to one embodiment. In addition, FIG. 4 depicts the top view of lower patterned mask 452. Particularly, FIG. 4 builds on FIG. 1, and further adds a lower patterned mask 400 and a layer of metal 402.

The lower patterned mask 400 may be a plurality of first areas corresponding to a plurality of electrically conductive pads 107 and a plurality of lower electrically conductive leads 110. The lower patterned mask 400 may be aligned on the top of a metal clad 103 of the flexible thermoelectric device 100.

The layer of metal 402 in a metal clad 103 may form the plurality of electrically conductive pad 107 and lower electrically conductive lead 110 when a metal outside the plurality of the first areas is removed in the layer of metal 402.

Figure 5:
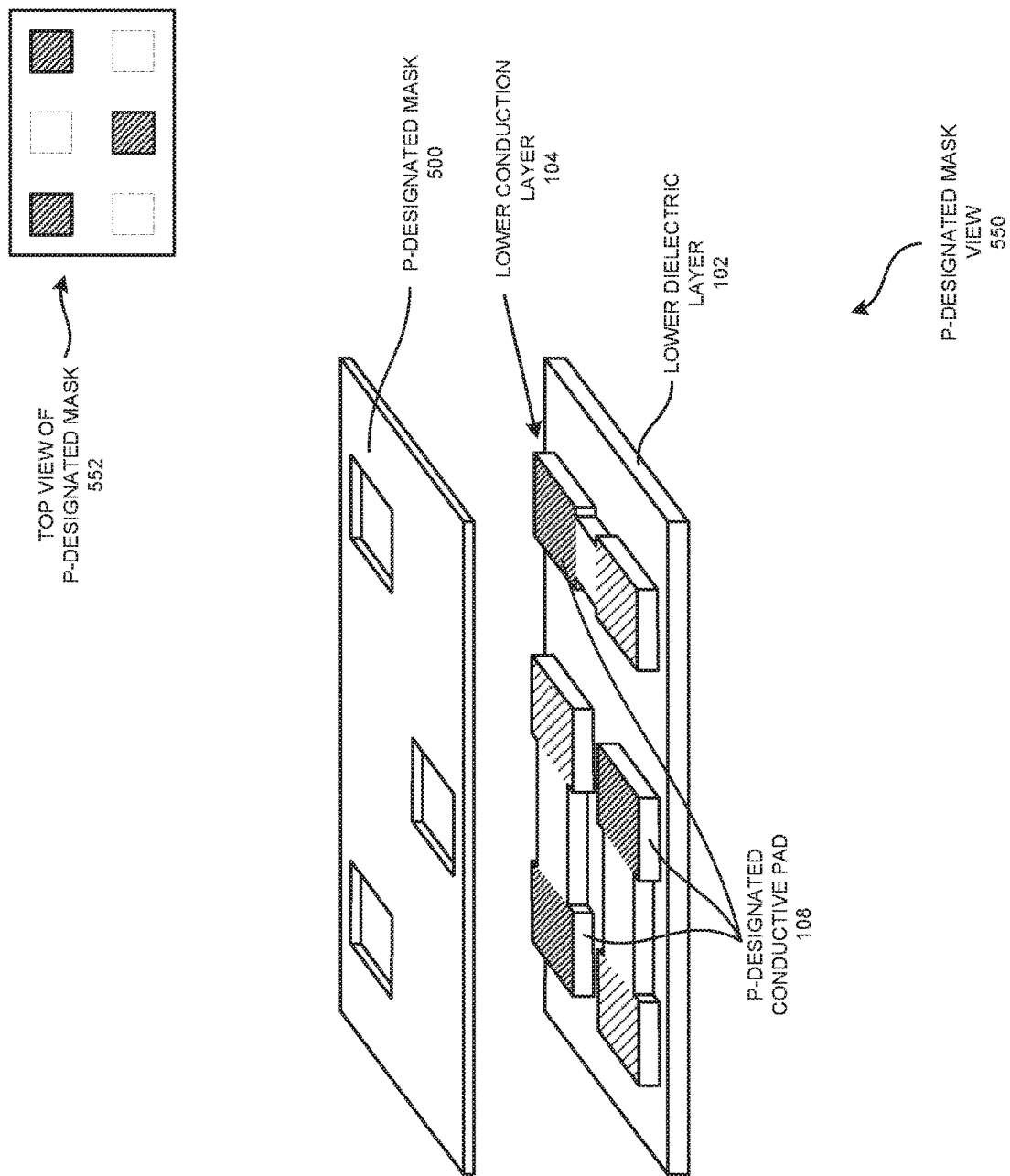
FIG. 5 is a P-designated mask view of the flexible thermoelectric device of FIG. 1, illustrating a P-designated mask aligned on top of the lower conduction layer in preparation for forming P-type conduits on top of P-designated conductive pads, according to one embodiment.

FIG. 5 is a P-designated mask view 550 of the flexible thermoelectric device 100 of FIG. 1, illustrating a P-designated mask 500 aligned on top of the lower conduction layer 104 in preparation for forming P-type conduits 114 on top of P-designated conductive pads 108, according to one embodiment. In addition, FIG. 5 shows a top view of P-designated mask 552. Particularly, FIG. 5 builds on FIG. 1, and further adds a P-designated mask 500.

The P-designated mask 500 may be a mask used to deposit, grow, etch and/or remove material to form one or more layer of P-type thermoelectric material 202 of one or more P-type conduit 114 above the P-designated conductive pad 108. It may also be a mask to deposit, grow, etch and/or remove material to form one or more barrier layer (e.g., barrier layer 300A, 300B or 300C) above the P-designated conductive pad 108. The P-designated mask 500 may have a first pattern corresponding to the plurality of P-designated conductive pads 108 of the lower conduction layer 104, such that the plurality of P-designated conductive pads 108 may be exposed through the P-designated mask 500.

Figure 6:
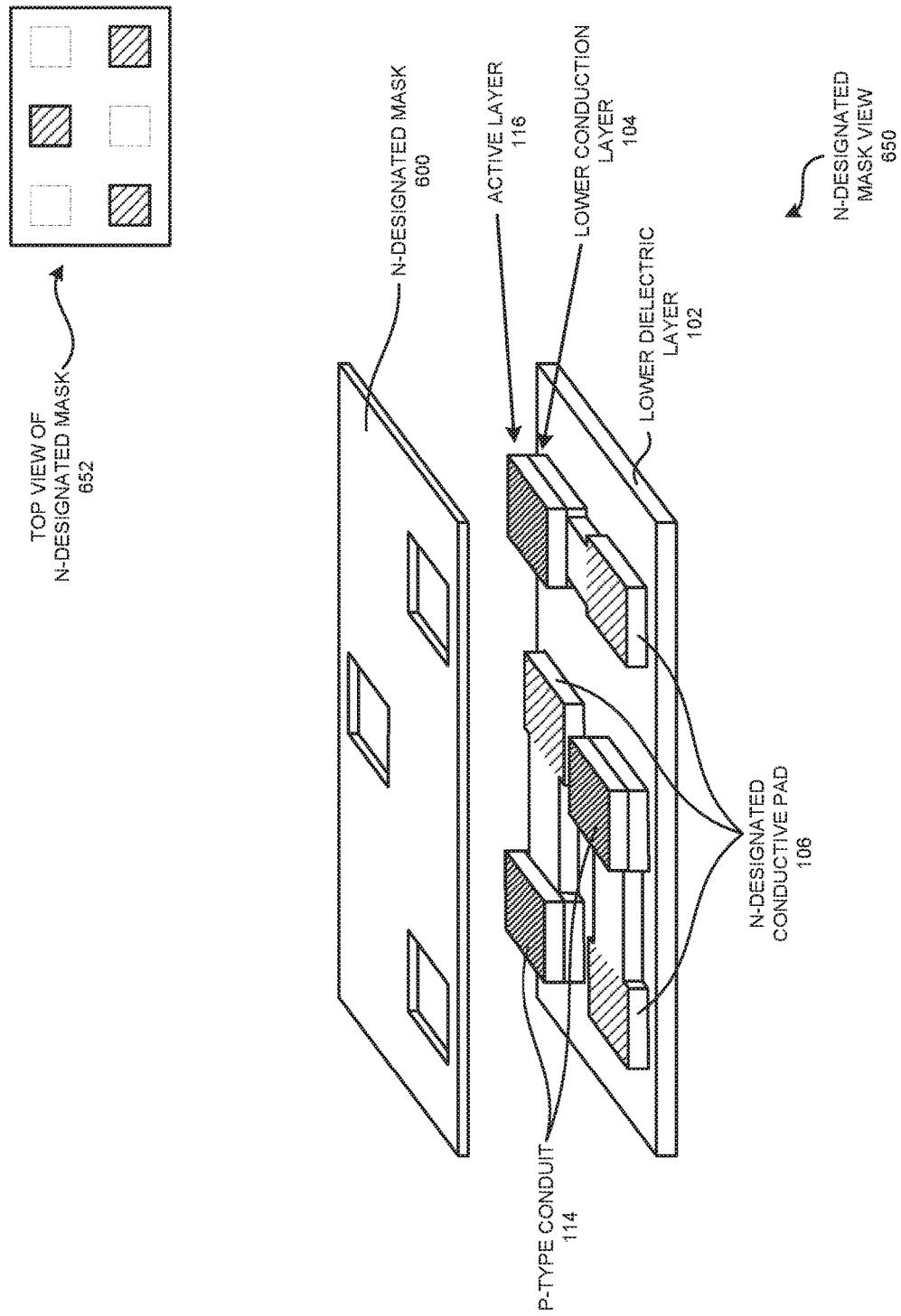
FIG. 6 is an N-designated mask view of the flexible thermoelectric device of FIG. 1, illustrating an N-designated mask aligned on top of the lower conduction layer in preparation for forming N-type conduits on top of N-designated conductive pads, according to one embodiment.

FIG. 6 is an N-designated mask view 650 of the flexible thermoelectric device 100 of FIG. 1, illustrating an N-designated mask 600 aligned on top of the lower conduction layer 104 in preparation for forming N-type conduits 112 on top of N-designated conductive pads 106, according to one embodiment. FIG. 6 further shows a top view of N-designated mask 652. Particularly, FIG. 6 builds on FIG. 1, and further adds an N-designated mask 600.

The N-designated mask 600 may be a mask used to deposit, grow, etch and/or remove material to form one or more layer of N-type thermoelectric material(s) 200 of the N-type conduit 112. The N-designated mask 600 may have a first pattern based on the plurality of N-designated conductive pads 106 of the lower conduction layer 104 such that the plurality of N-designated conductive pads 106 of the lower conduction layer 104 may be exposed through the N-designated mask 600.

Figure 7:
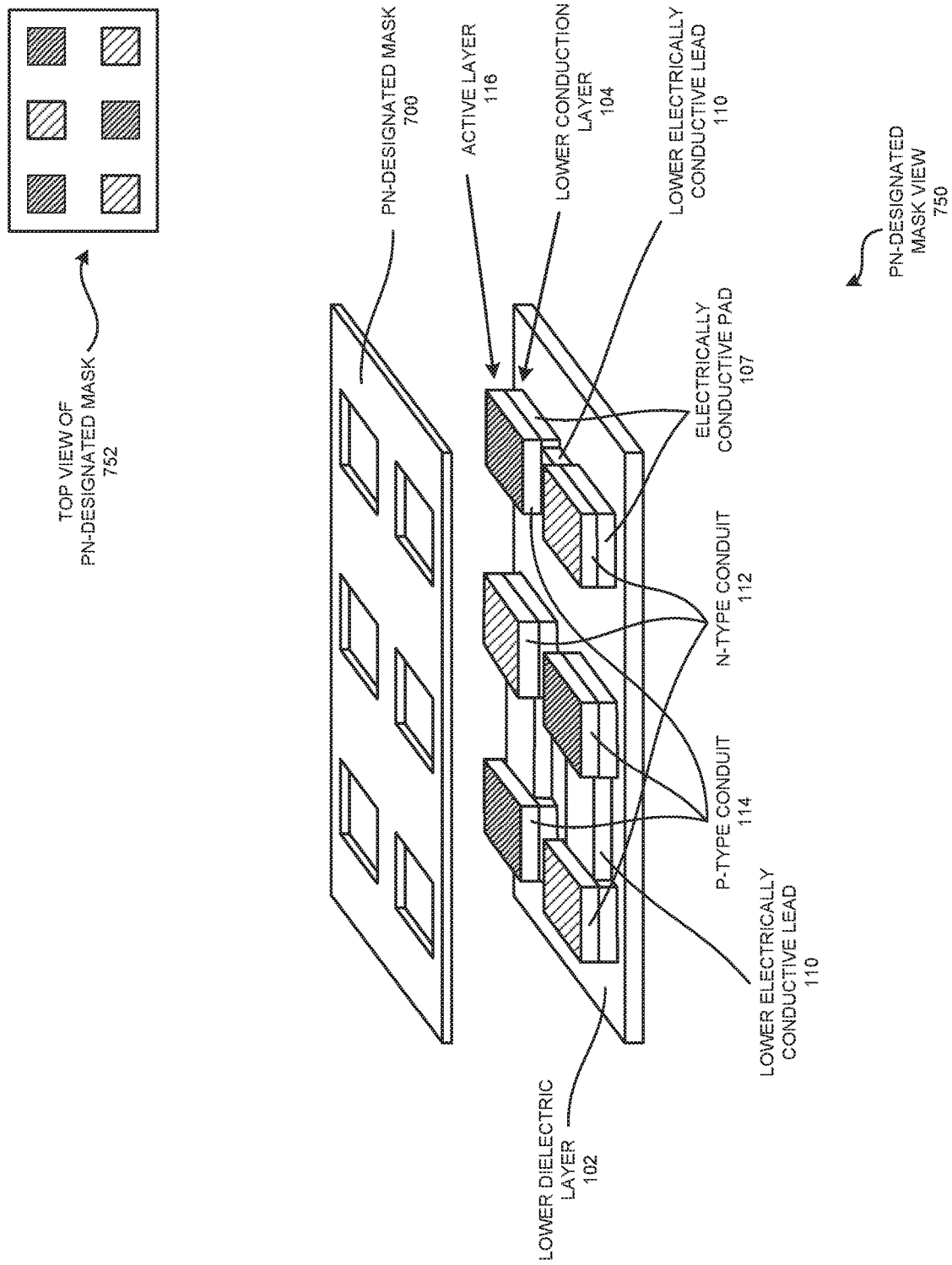
FIG. 7 is a PN-designated mask view of the flexible thermoelectric device of FIG. 1, illustrating a PN-designated mask aligned on top of the lower conduction layer in preparation for forming a barrier layer on P-type conduits and N-type conduits, according to one embodiment.

FIG. 7 is a PN-designated mask view 750 of the flexible thermoelectric device 100 of FIG. 1, illustrating a PN-designated mask 700 aligned on top of the lower conduction layer 104 in preparation for forming a barrier layer (e.g., barrier layer 300A, 300B and 300C) on P-type conduits 114 and N-type conduits 112, according to one embodiment. FIG. 7 further shows a top view of PN-designated mask 752. Particularly, FIG. 7 builds on FIG. 1, and further adds a PN-designated mask 700.

The PN-designated mask 700 may be a mask used to deposit, grow, etch and/or remove material to form one or more layer of N-type thermoelectric material 200, P-type thermoelectric material 202, and/or other material for a barrier layer (e.g., barrier layer 300A, 300B and 300C). The PN-designated mask 700 may have a pattern such that at least one of the N-designated conductive pads 106 and P-designated conductive pads 108 of the lower conduction layer 104 may be exposed through the PN-designated mask 700.

Figure 8:
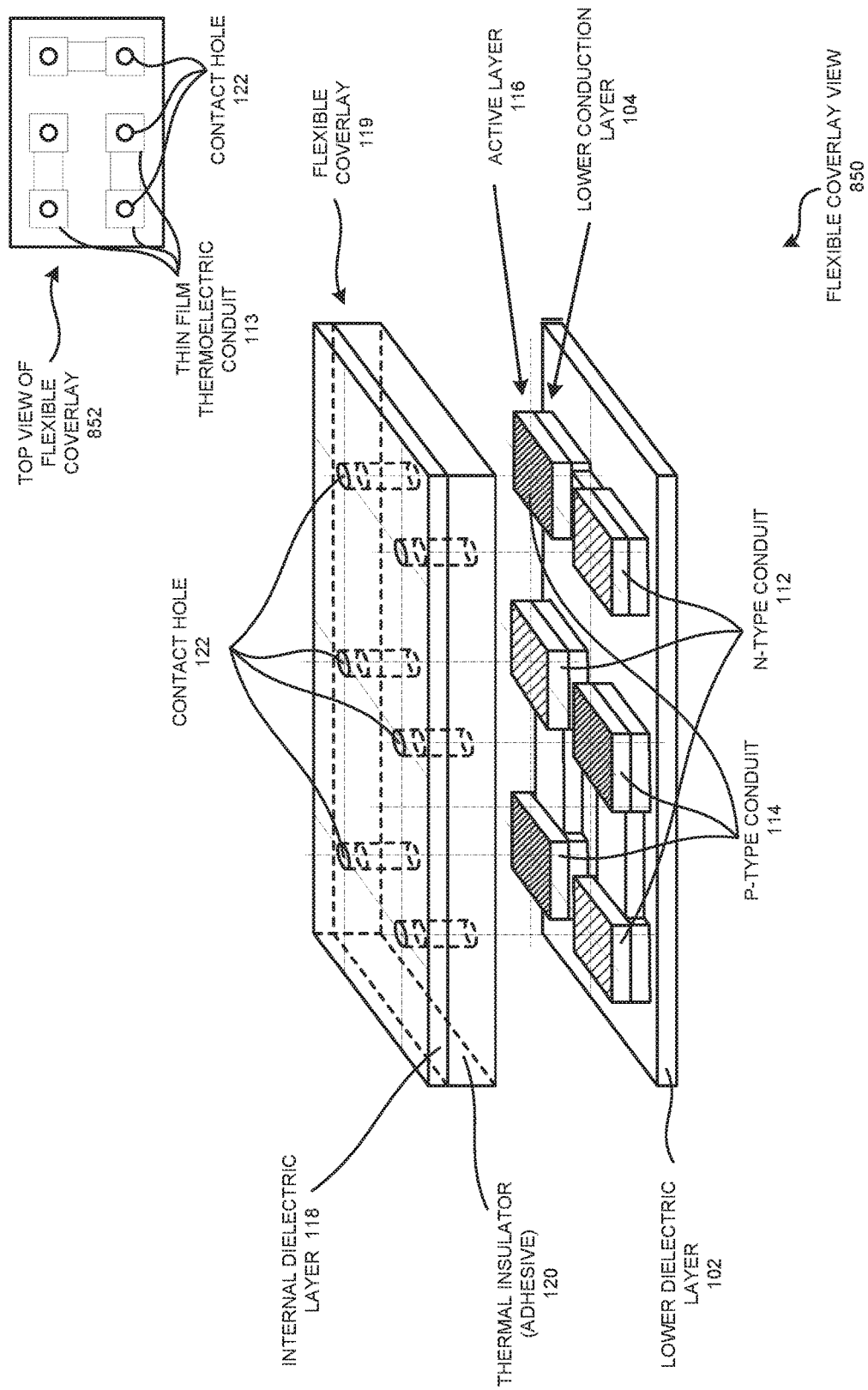
FIG. 8 is a flexible coverlay view of the flexible thermoelectric device of FIG. 1, illustrating a flexible coverlay with drilled contact holes aligned on top of P-type conduits and N-type conduits in preparation for lamination, according to one embodiment.

FIG. 8 a flexible coverlay view 850 of the flexible thermoelectric device 100 of FIG. 1, illustrating a flexible coverlay 119 with drilled contact holes 122 aligned on top of P-type conduits 114 and N-type conduits 112 in preparation for lamination, according to one embodiment. Further, FIG. 8 shows a top view of flexible coverlay 852.

During lamination, the flexible coverlay 119 is pressed against the lower conduction layer 104 under controlled conditions so that the layer of adhesive (e.g., thermal insulator (adhesive) 120)) deforms and fills a space around each of the P-type conduits 114 and N-type conduits 112. The controlled conditions may include temperature control, and/or pressure control.

Figure 9:
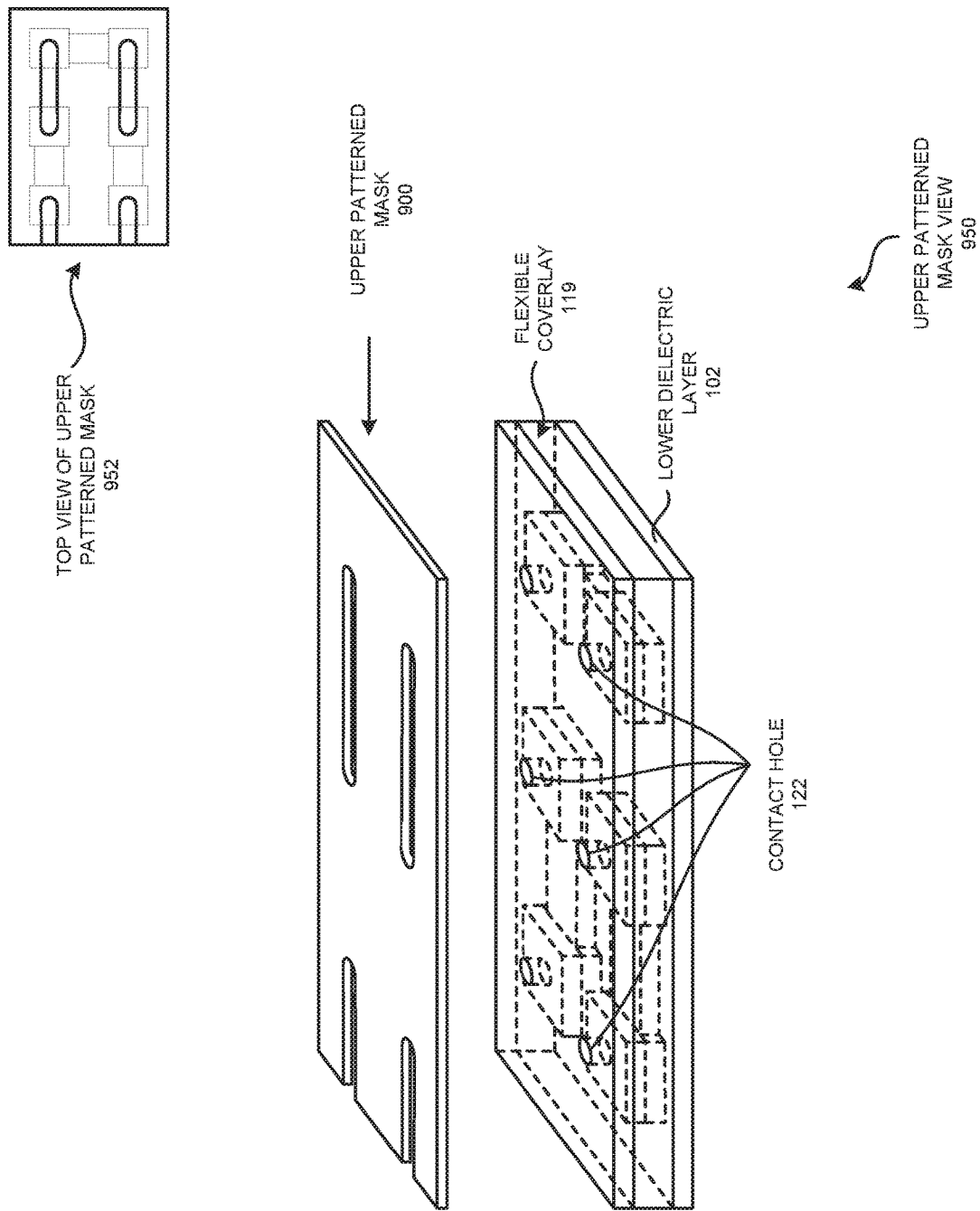
FIG. 9 is an upper patterned mask view of the flexible thermoelectric device of FIG. 1, illustrating an upper patterned mask aligned on top of the contact holes in the flexible coverlay in preparation for forming an upper conduction layer on top of and through the flexible coverlay using the upper patterned mask, according to one embodiment.

FIG. 9 is an upper patterned mask view 950 of the flexible thermoelectric device 100 of FIG. 1, illustrating an upper patterned mask 900 aligned on top of the contact holes 122 in the flexible coverlay 119 in preparation for forming an upper conduction layer 124 on top of and through the flexible coverlay 119 using the upper patterned mask 900, according to one embodiment. FIG. 9 further shows a top view of upper patterned mask 952. Particularly, FIG. 9 builds on FIG. 1, and further adds an upper patterned mask 900.

The upper patterned mask 900 may be a mask used to deposit, grow, etch and/or remove material to form the upper conduction layer 124. The upper patterned mask 900 has a plurality of second areas corresponding to the plurality of P-designated contact holes (e.g., contact holes 122) and N-designated contact holes (e.g., contact holes 122), and a plurality of upper electrically conductive leads 128.

Figure 10:
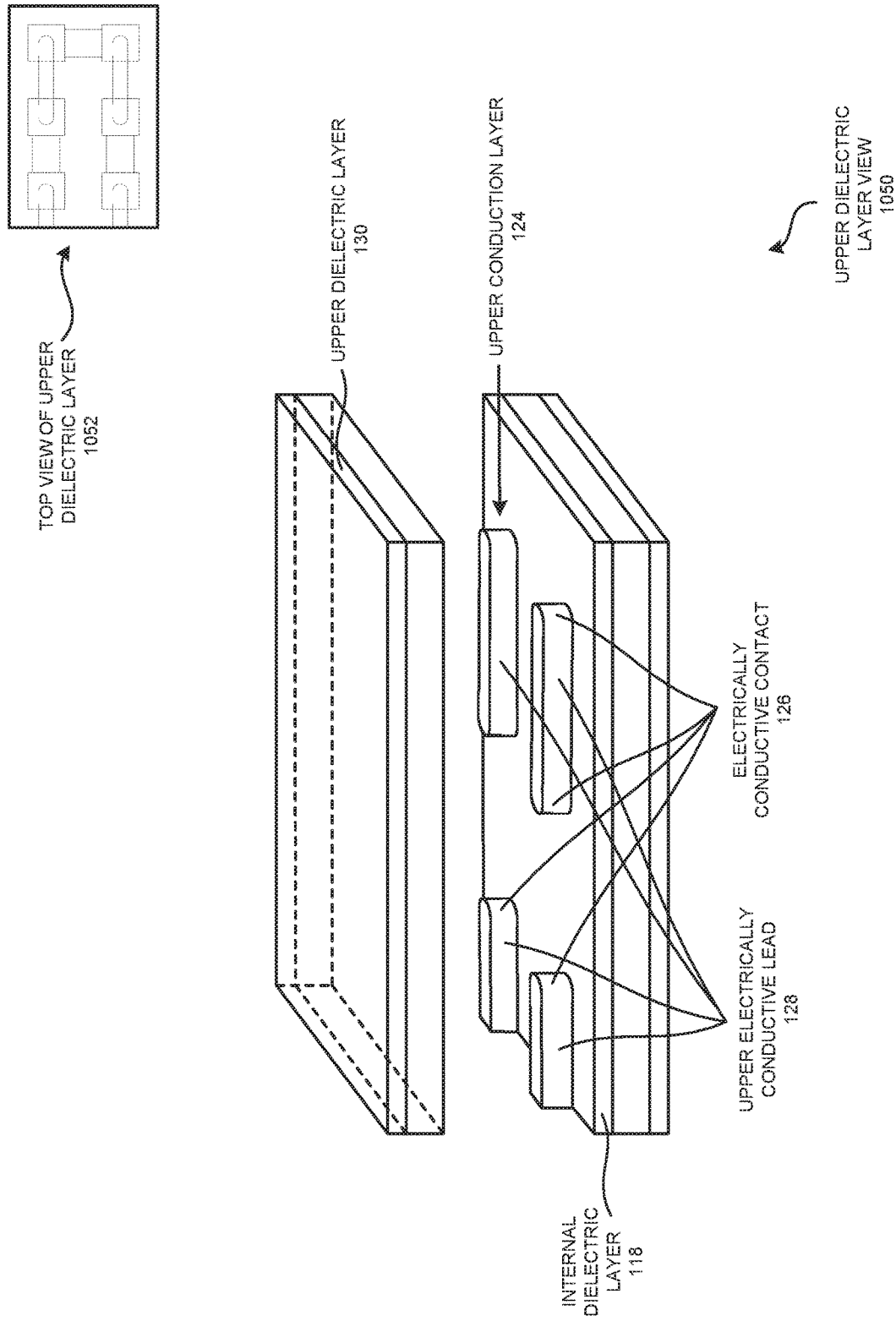
FIG. 10 is an upper dielectric layer view of the flexible thermoelectric device of FIG. 1, illustrating an upper dielectric layer formed on top of the upper conduction layer and the internal dielectric layer, according to one embodiment.

FIG. 10 is an upper dielectric layer view 1050 of the flexible thermoelectric device 100 of FIG. 1, illustrating an upper dielectric layer 130 formed on top of the upper conduction layer 124 and the internal dielectric layer 118, according to one embodiment. Further, FIG. 10 shows a top view of upper dielectric layer 1052. The flexible thermoelectric device 100 may be sealed and protected with the upper dielectric layer 130. The upper dielectric layer 130 may be a flexible polymer, a polymer composite, a polyimide, a polyacrylate, a polyvinyl acetate and/or a mylar. Further, the upper dielectric layer 130 may be an electrical insulator and good thermal conductor having the thermal conductivity value greater than 5 watts per meter kelvin (W/(mK)).

Figure 11:
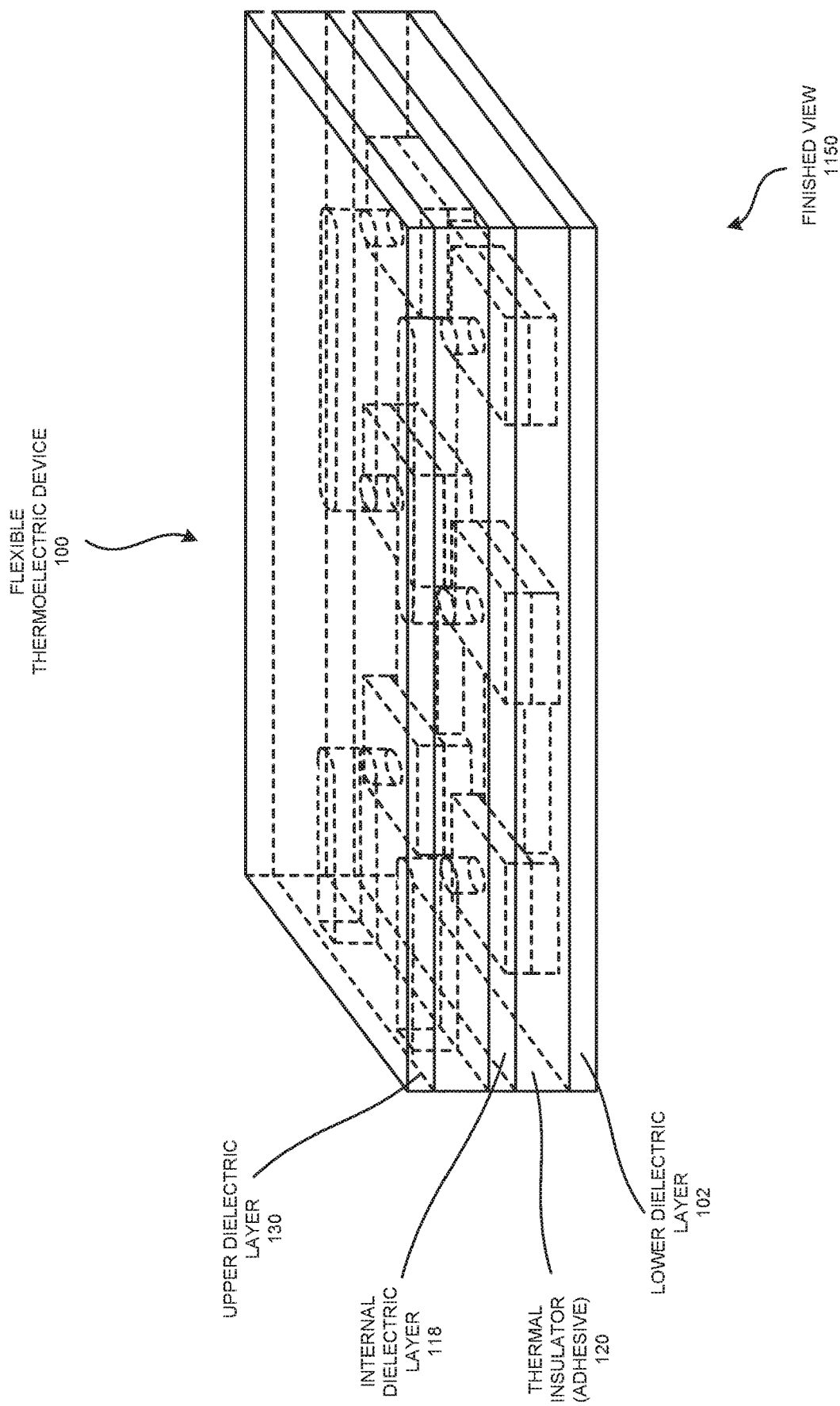
FIG. 11 illustrates the finished view of the flexible thermoelectric device of FIG. 1, according to one embodiment.

FIG. 11 is a finished view 1150 of the flexible thermoelectric device 100 of FIG. 1, according to one embodiment. When finished, the flexible thermoelectric device 100 may include an upper dielectric layer 130, an internal dielectric layer 118, a thermal insulator (adhesive) 120 and a lower dielectric layer 102.

The finished flexible thermoelectric device 100 may be produced by forming a lower conduction layer 104 on top of a lower dielectric layer 102, aligning an N-designated mask 600 on top of the lower conduction layer 104, forming a plurality of N-type conduits 112 each on top of one of the N-designated conductive pads 106, aligning a P-designated mask 500 on top of the lower conduction layer 104, forming a plurality of P-type conduits 114 each on top of one of the P-designated conductive pads 108, laminating a layer of thermal insulator on top of and around the plurality of N-type conduits 112 and P-type conduits 114, drilling a plurality of contact holes 122 each through the internal dielectric layer 118 and the layer of thermal insulator, forming an upper conduction layer 124 on top of the internal dielectric layer 118, and forming an upper dielectric layer 130 on top of the upper conduction layer 124, according to one embodiment.

Figure 12:
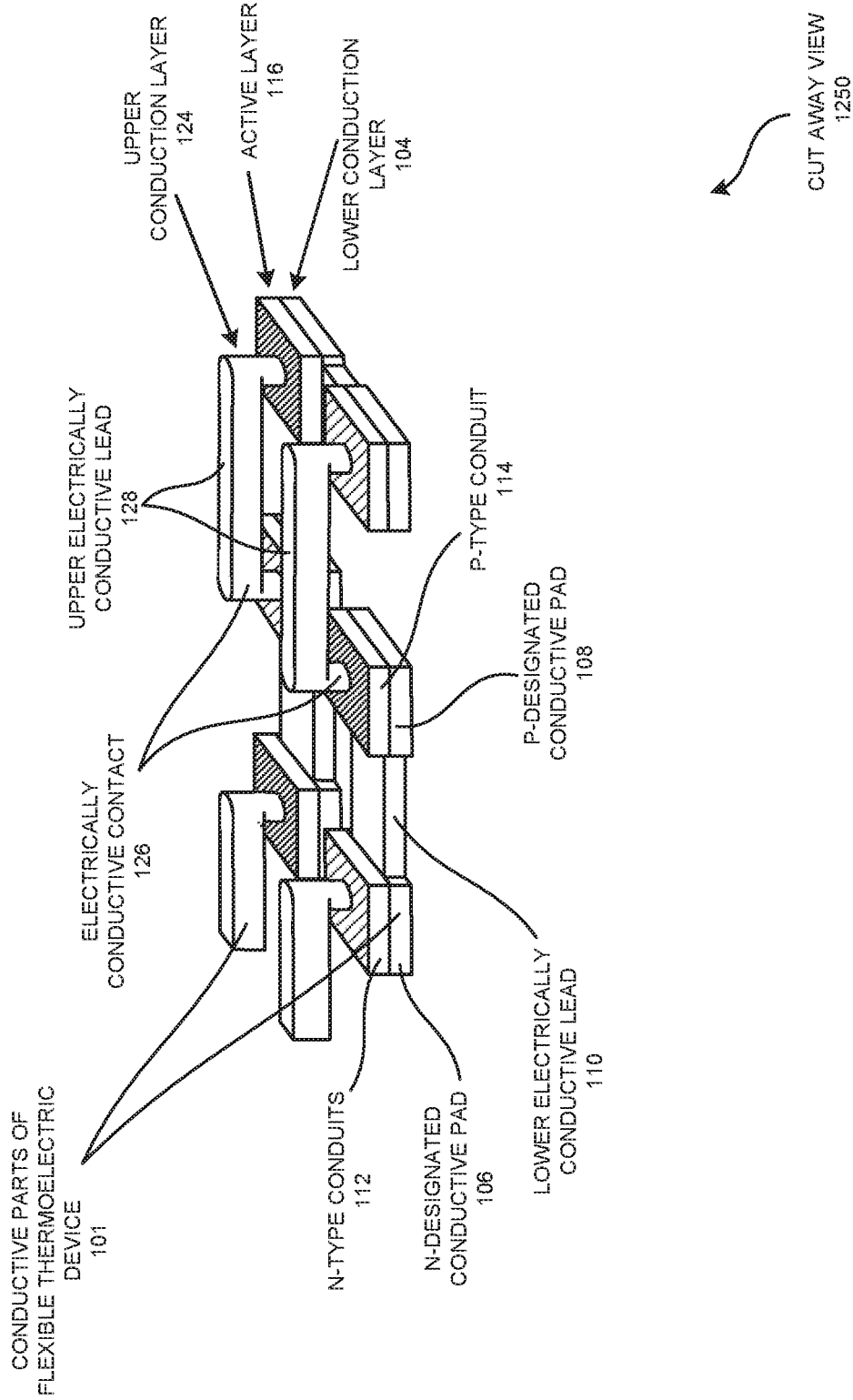
FIG. 12 illustrates the cut away view of the flexible thermoelectric device of FIG. 1 with the dielectrics and thermal insulators removed, illustrating the thermoelectric conduits electrically connected in series via the upper conduction layer and lower conduction layer, according to one embodiment.

FIG. 12 is a cut away view 1250 of the flexible thermoelectric device 100 of FIG. 1 with the dielectrics (e.g., lower dielectric layer 102, internal dielectric layer 118 and upper dielectric layer 130) and thermal insulators (e.g., thermal insulator (adhesive) 120) removed, illustrating the thermoelectric conduits (e.g., N-type conduits 112 and/or P-type conduits 114) electrically connected in series via the upper conduction layer 124 and lower conduction layer 104, according to one embodiment.

Figure 13:
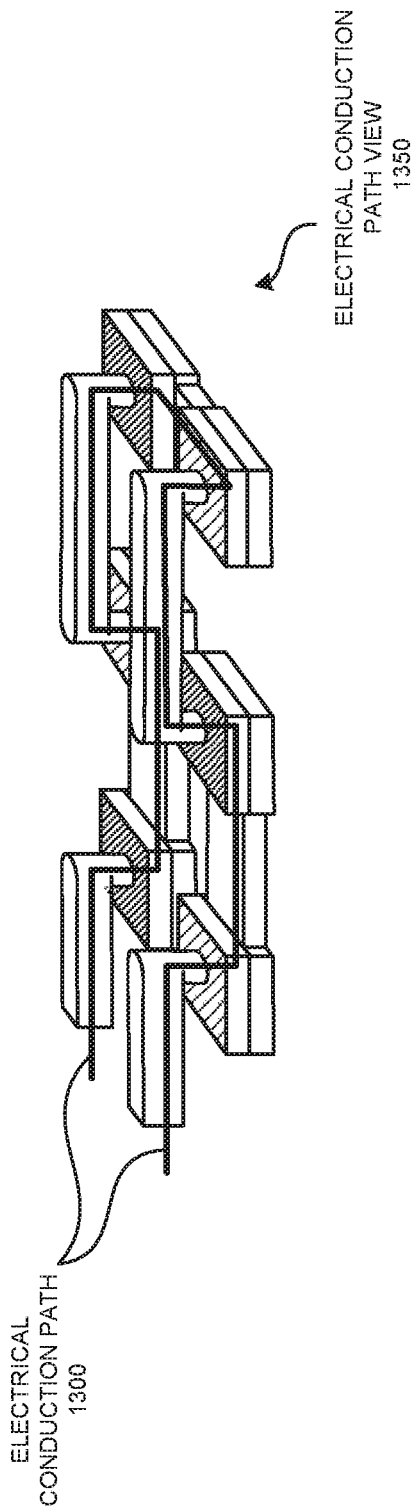
FIG. 13 is an electrical conduction path view of the flexible thermoelectric device of FIG. 1, illustrating the electrical conduction path through the series of interconnecting P-type conduits and N-type conduits of the flexible thermoelectric device, according to one embodiment.

FIG. 13 is an electrical conduction path view 1350 of the flexible thermoelectric device 100 of FIG. 1, illustrating the electrical conduction path 1300 through the interconnected P-type conduits 114 and N-type conduits 112 of the flexible thermoelectric device 100, according to one embodiment. Particularly, FIG. 13 builds on FIG. 1, and further adds an electrical conduction path 1300.

The electrical conduction path 1300 is a zig-zag pattern that goes through the P-type conduits 114 and N-type conduits 112 in the active layer 116, the electrically conductive pads 107 and the lower electrically conductive leads 110 in the lower conduction layer 104, and the electrically conductive contact 126 and upper electrically conductive lead 128 in the upper conduction layer 124. Although an electrical energy may flow momentarily in the vertical direction in the electrical conduction path 1300, the net flow of the electrical energy is in the horizontal direction in the flexible thermoelectric device 100.

Figure 14:
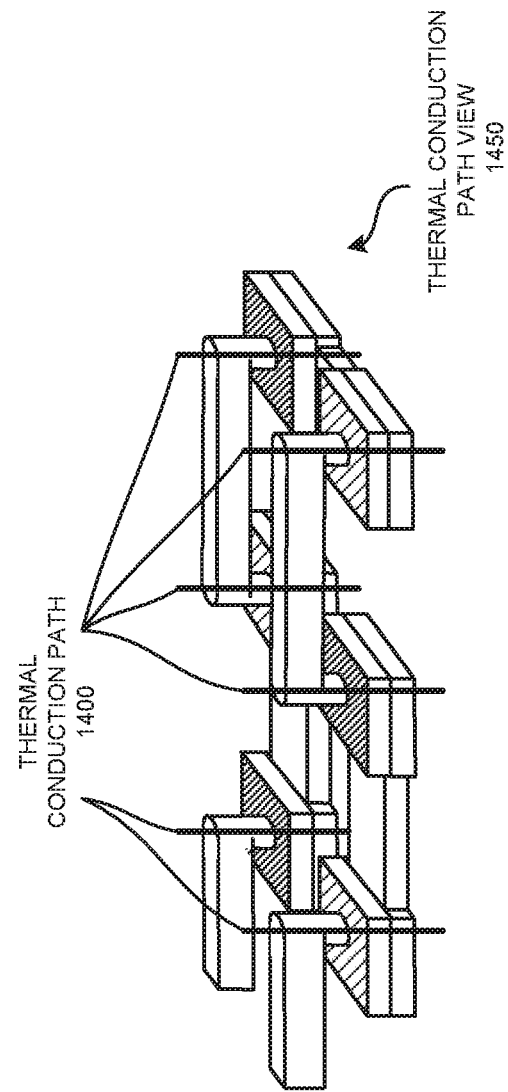
FIG. 14 is a thermal conduction path view of the flexible thermoelectric device of FIG. 1, illustrating a plurality of thermal conduction paths each going through one of the P-type conduits and N-type conduits of the flexible thermoelectric device, according to one embodiment.

FIG. 14 is a thermal conduction path view 1450 of the flexible thermoelectric device 100 of FIG. 1, illustrating a plurality of thermal conduction paths 1400 each going through one of the P-type conduits 114 and N-type conduits 112 of the flexible thermoelectric device, according to one embodiment. Particularly, FIG. 14 builds on FIG. 1, and further adds a thermal conduction path 1400.

The thermal conduction paths 1400 are vertical. Heat energy moves through each of the P-type conduits 114 and N-type conduits 112 without leaking into other neighboring conduits.

Consider an example case. Suppose a temperature gradient exists between the two sides (e.g., the lower side and the upper side in FIG. 11 and FIG. 12) of the flexible thermoelectric device 100. Without loss of generality, suppose the temperature on the lower side in FIG. 11 and FIG. 12 is higher than the upper side by 10 degrees Kelvin. As the lower dielectric layer 102 is a good thermal conductor, the temperature at the lower conduction layer 104 may be similar to the lower side temperature. Similarly, as the upper dielectric layer 130 is a good thermal conductor, the temperature at the upper conduction layer 124 may be similar to the upper side temperature. Thus the temperature gradient on the two sides of the P-type conduits 114 and N-type conduits 112 may be similar to the outside temperature gradient (10 degree Kelvin in the example). As the P-type conduits 114 and N-type conduits 112 are surrounded by thermal insulators (adhesive) 120, the heat energy may travel through the P-type conduits 114 and N-type conduits 112 vertically from hot to cold without leaking to other surrounding conduits. The temperature gradient causes the holes in the P-type conduits 114 to move from cold to hot, and the electrons in the N-type conduits 112 to move from hot to cold generating electric current and closing the loop. The P-type conduits 114 and N-type conduits 112 are electrically connected in series such that their voltages are added to build a meaningful combined voltage. The net direction of the electric current is in the horizontal direction while keeping the direction of heat flow constant in vertical direction from hot to cold.

Figure 15A:
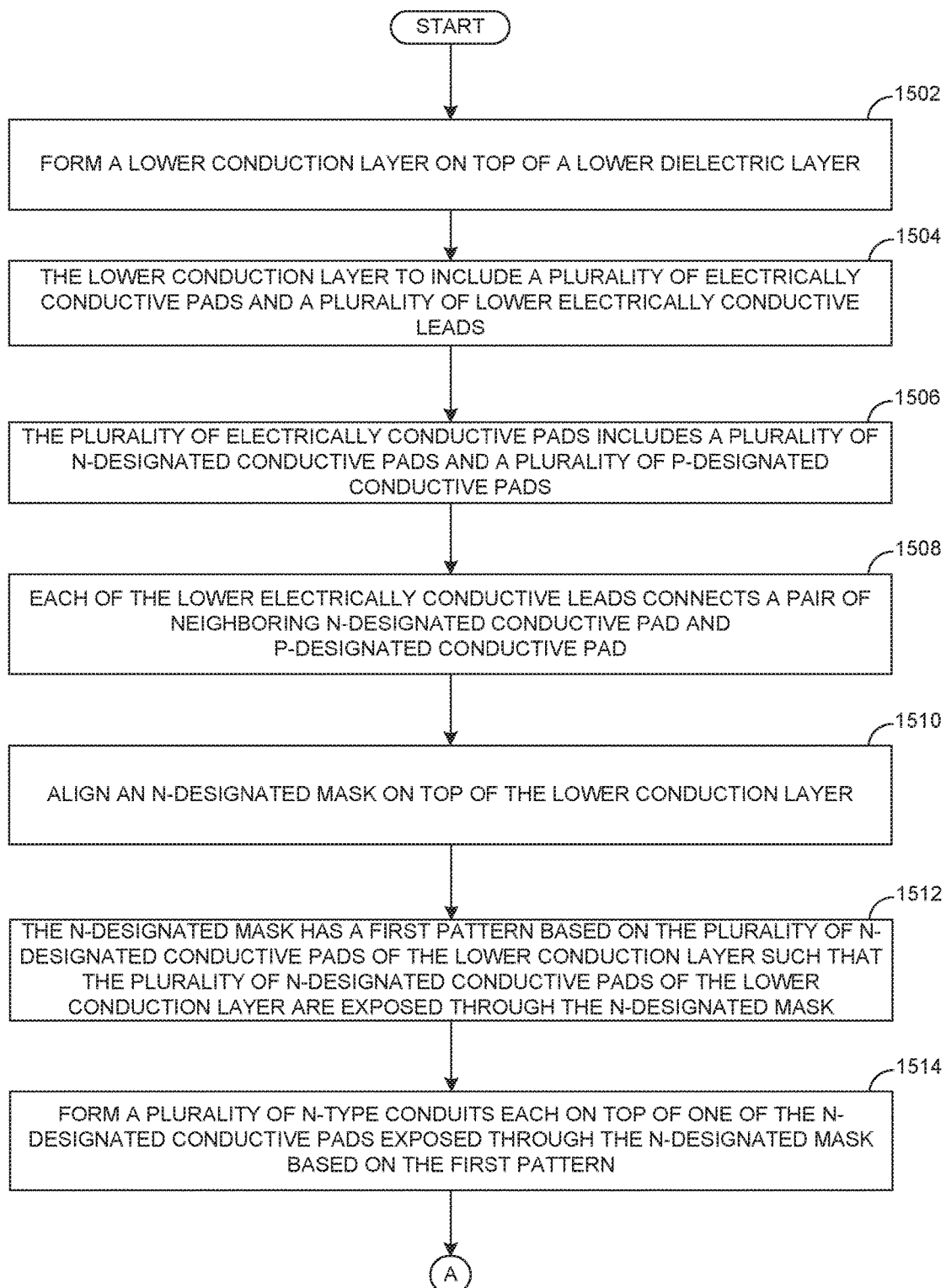
FIG. 15A shows a process flow to produce a flexible thermoelectric device of FIG. 1, according to one embodiment.

FIG. 15A shows a process flow 1550 to produce a flexible thermoelectric device 100 of FIG. 1, according to one embodiment.

In operation 1502, the lower conduction layer 104 may be formed on top of the lower dielectric layer 102.

In operation 1504, the lower conduction layer 104 may include a plurality of electrically conductive pads 107 and a plurality of lower electrically conductive leads 110, according to one embodiment.

In operation 1506, the plurality of electrically conductive pads 107 may include a plurality of N-designated conductive pads 106 and a plurality of P-designated conductive pads 108, according to one embodiment.

In operation 1508, each of the lower electrically conductive leads 110 may connect a pair of neighboring N-designated conductive pad 106 and P-designated conductive pad 108, according to one embodiment.

In operation 1510, an N-designated mask 600 may be aligned on top of the lower conduction layer 104, according to one embodiment.

In operation 1512, the N-designated mask 600 may have a first pattern based on the plurality of N-designated conductive pads 106 of the lower conduction layer 104 such that the plurality of N-designated conductive pads 106 of the lower conduction layer 104 may be exposed through the N-designated mask 600, according to one embodiment.

In operation 1514, a plurality of N-type conduits 112 may be formed each on top of one of the N-designated conductive pads 106 exposed through the N-designated mask 600 based on the first pattern, according to one embodiment.

Figure 15B:
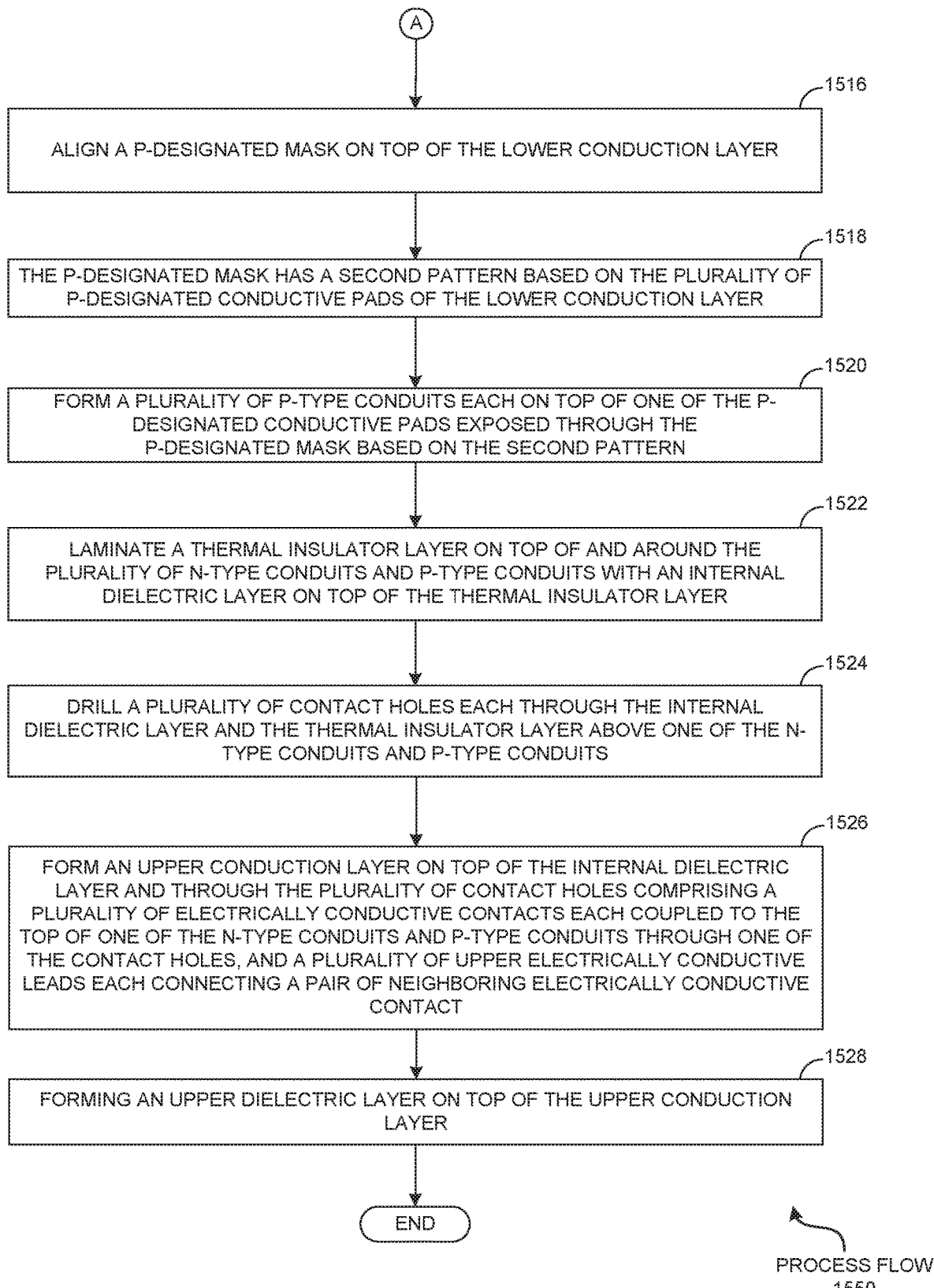
FIG. 15B is continuation of the process flow of FIG. 15A, according to one embodiment.

FIG. 15B is a continuation of the process flow 1550 of FIG. 15A, according to one embodiment.

In operation 1516, a P-designated mask 500 may be aligned on top of the lower conduction layer 104, according to one embodiment.

In operation 1518, the P-designated mask 500 may have a second pattern based on the plurality of P-designated conductive pads 108 of the lower conduction layer 104, according to one embodiment.

In operation 1520, a plurality of P-type conduits 114 may be formed each on top of one of the P-designated conductive pads 108 exposed through the P-designated mask 500 based on the second pattern, according to one embodiment.

In operation 1522, a layer of thermal insulator 120 may be laminated on top of and around the plurality of N-type conduits 112 and P-type conduits 114 with an internal dielectric layer 118 on top of the thermal insulator 120 layer, according to one embodiment.

In operation 1524, a plurality of contact holes 122 may be drilled each through the internal dielectric layer 118 and the thermal insulator 120 layer above one of the N-type conduits 112 and P-type conduits 114, according to one embodiment.

In operation 1526, an upper conduction layer 124 may be formed on top of the internal dielectric layer 118 and through the plurality of contact holes 122. The upper conduction layer 124 may include a plurality of electrically conductive contacts 126 and a plurality of upper electrically conductive leads 128. Each of the electrically conductive contacts 126 is coupled to the top of one of the N-type conduits 112 and P-type conduits 114 through one of the contact holes 122. Each of the upper electrically conductive leads 128 connects a pair of neighboring electrically conductive contact 126, according to one embodiment.

In operation 1528, an upper dielectric layer 130 may be formed on top of the upper conduction layer 124, according to one embodiment.

Figure 16A:
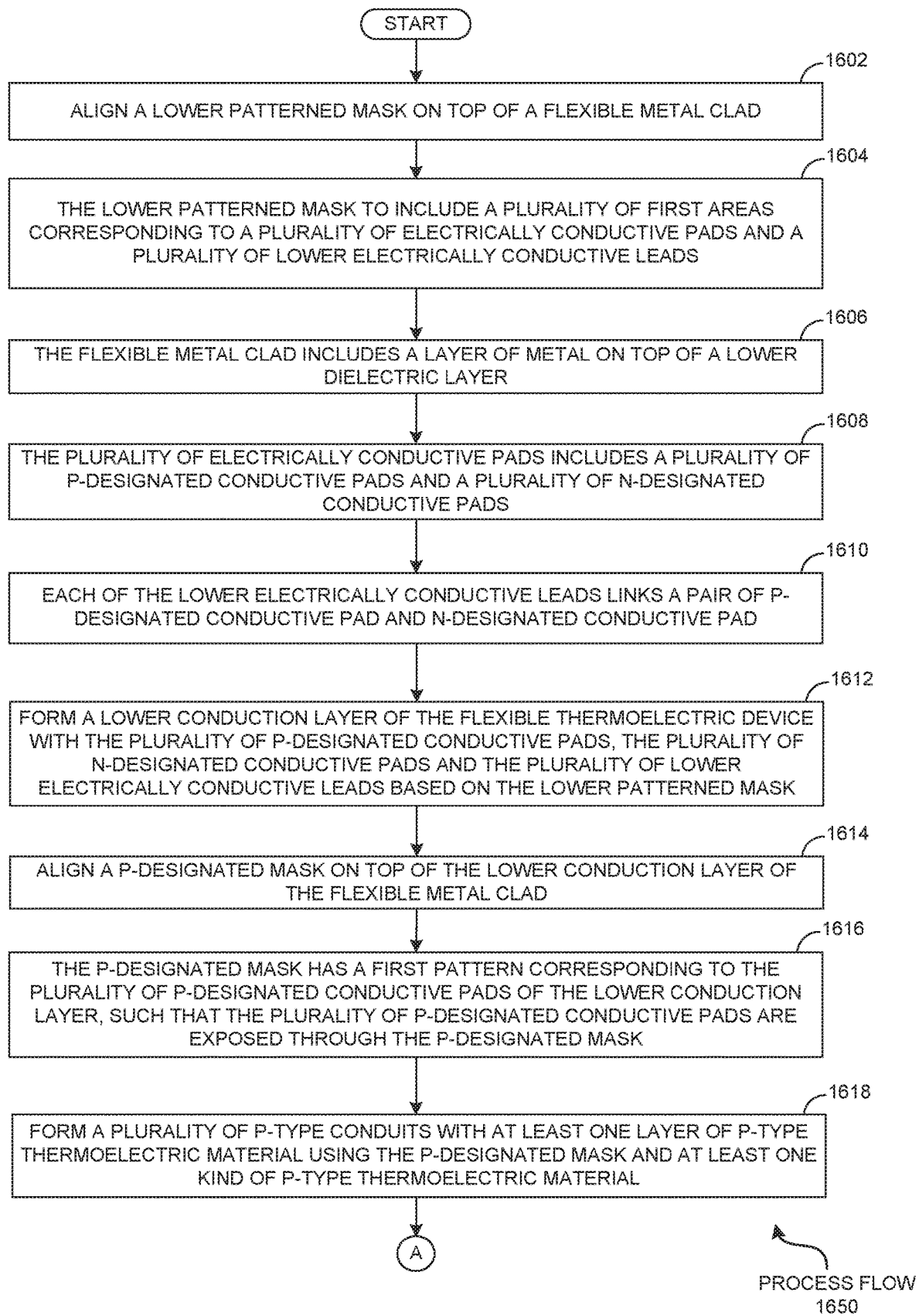
FIG. 16A illustrates another process flow to produce a flexible thermoelectric device of FIG. 1, according to one embodiment.

FIG. 16A illustrates another process flow 1650 to produce a flexible thermoelectric device 100 of FIG. 1 from directly deposited thermoelectric materials, according to one embodiment.

In operation 1602, a lower patterned mask 400 may be aligned on top of a flexible metal clad 103, according to one embodiment.

In operation 1604, the lower patterned mask 400 may include a plurality of first areas corresponding to a plurality of electrically conductive pads 107 and a plurality of lower electrically conductive leads 110, according to one embodiment.

In operation 1606, the flexible metal clad 103 may include a layer of metal 402 on top of a lower dielectric layer 102, according to one embodiment.

In operation 1608, the plurality of electrically conductive pads 107 may include a plurality of P-designated conductive pads 108 and a plurality of N-designated conductive pads 106, according to one embodiment.

In operation 1610, each of the lower electrically conductive leads 110 may link a pair of P-designated conductive pad 108 and N-designated conductive pad 106, according to one embodiment.

In operation 1612, a lower conduction layer 104 of the flexible thermoelectric device 100 may be formed with the plurality of P-designated conductive pads 108, the plurality of N-designated conductive pads 106 and the plurality lower electrically conductive leads 110 based on the lower patterned mask 400, according to one embodiment.

In operation 1614, a P-designated mask 500 may be aligned on top of the lower conduction layer 104 of the flexible metal clad 103, according to one embodiment.

In operation 1616, the P-designated mask 500 may have a first pattern corresponding to the plurality of P-designated conductive pads 108 of the lower conduction layer 104 such that the plurality of P-designated conductive pads 108 are exposed through the P-designated mask 500, according to one embodiment.

In operation 1618, a plurality of P-type conduits 114 may be formed with one or more layer of P-type thermoelectric material 202 using the P-designated mask 500 and one or more kind of the P-type thermoelectric material 202, according to one embodiment.

Figure 16B:
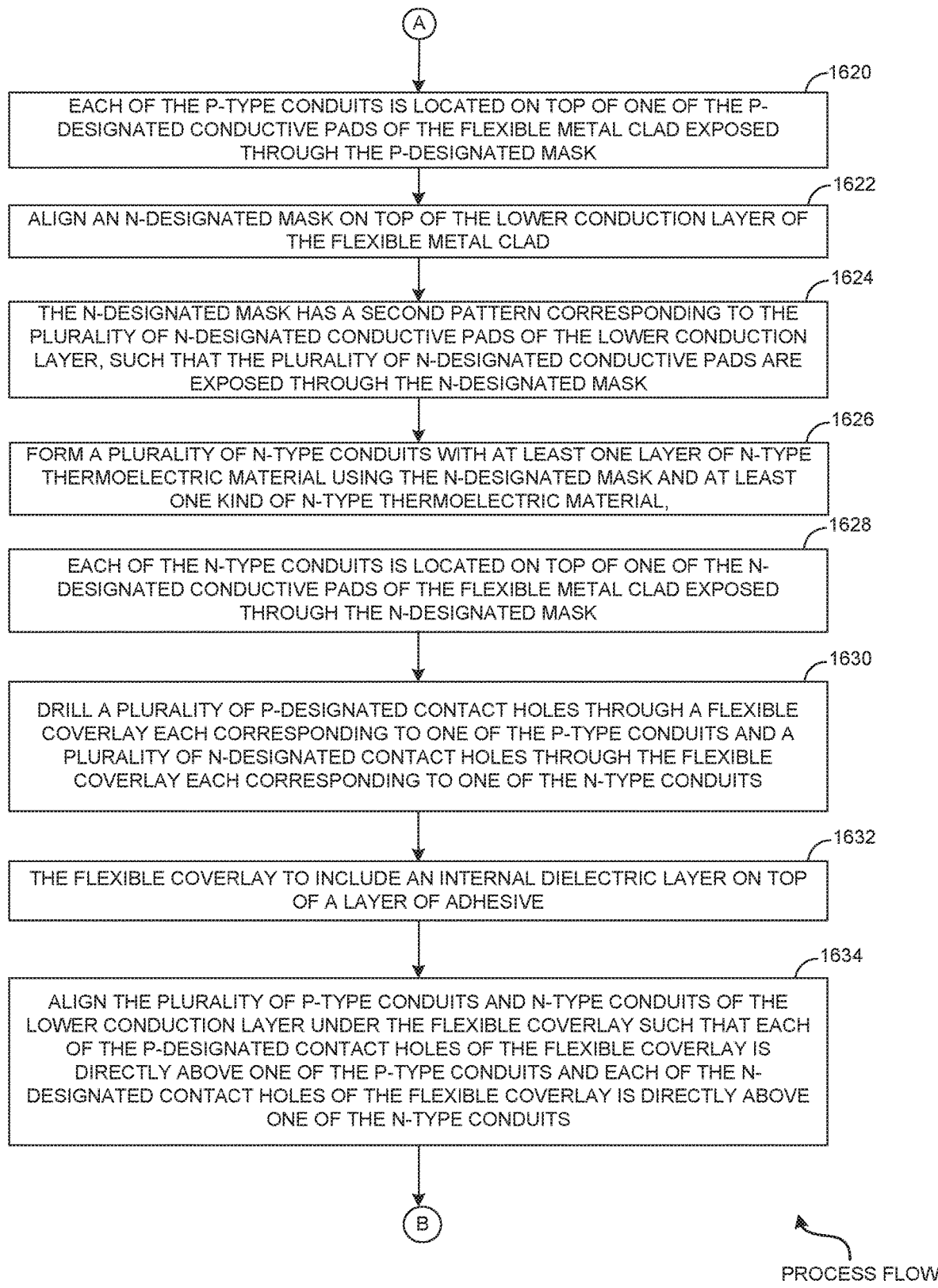
FIG. 16B is continuation of the process flow of FIG. 16A, according to one embodiment.

FIG. 16B is continuation of the process flow 1650 of FIG. 16A, according to one embodiment.

In operation 1620, each of the P-type conduits 114 may be located on top of one of the plurality P-designated conductive pads 108 of the flexible metal clad 103 exposed through the P-designated mask 500, according to one embodiment.

In operation 1622, an N-designated mask 600 may be aligned on top of the lower conduction layer 104 of the flexible metal clad 103, according to one embodiment.

In operation 1624, the N-designated mask 600 may have a second pattern corresponding to the plurality of N-designated conductive pads 106 of the lower conduction layer 104 such that the plurality of N-designated conductive pads 106 are exposed through the N-designated mask 600, according to one embodiment.

In operation 1626, a plurality of N-type conduits 112 may be formed with one or more layer of N-type thermoelectric material 200 using the N-designated mask 600 and one or more kind of N-type thermoelectric material 200, according to one embodiment.

In operation 1628, each of the N-type conduits 112 may be located on top of one of the N-designated conductive pads 106 of the flexible metal clad 103 exposed through the N-designated mask 600, according to one embodiment.

In operation 1630, a plurality of P-designated contact holes (e.g., contact holes 122) may be drilled through a flexible coverlay 119 each corresponding to one of the P-type conduits 114, and a plurality of N-designated contact holes (e.g., contact holes 122) may be drilled through the flexible coverlay 119 each corresponding to one of the N-type conduits 112, according to one embodiment.

In operation 1632, the flexible coverlay 119 may include an internal dielectric layer 118 on top of a layer of adhesive, according to one embodiment.

In operation 1634, the plurality of P-type conduits 114 and N-type conduits 112 of the lower conduction layer 104 may be aligned under the flexible coverlay 119 such that each of the P-designated contact holes (e.g., contact holes 122) of the flexible coverlay 119 is directly above one of the P-type conduits 114 and each of the N-designated contact holes (e.g., contact holes 122) of the flexible coverlay 119 is directly above one of the N-type conduits 112, according to one embodiment.

Figure 16C:
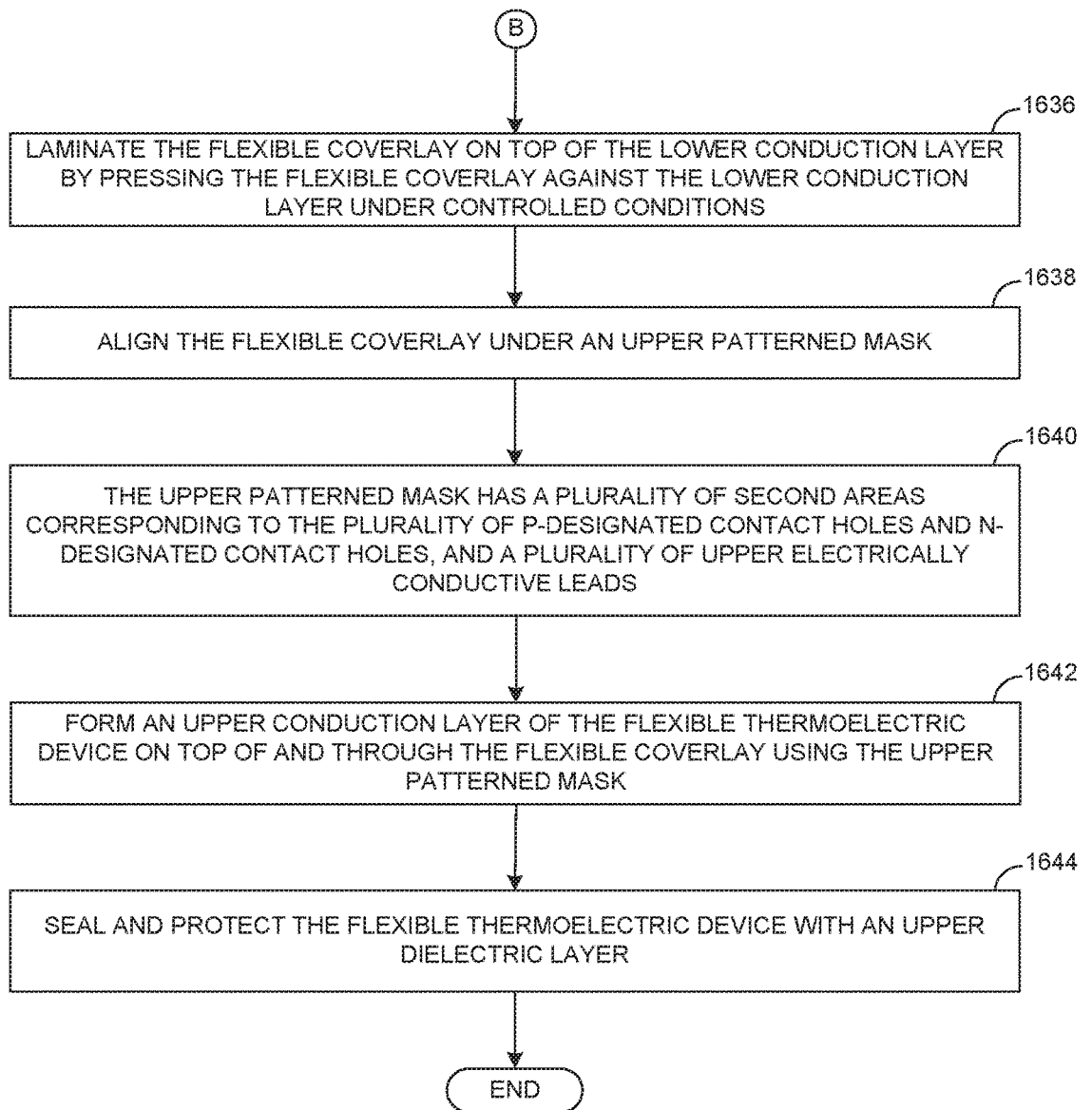
FIG. 16C is continuation of the process flow of FIG. 16B, according to one embodiment.

FIG. 16C is continuation of the process flow 1650 of FIG. 16A, according to one embodiment.

In operation 1636, the flexible coverlay 119 may be laminated on top of the lower conduction layer 104 by pressing the flexible coverlay 119 against the lower conduction layer 104 under controlled conditions, according to one embodiment.

In operation 1638, the flexible coverlay 119 may be aligned under an upper patterned mask 900, according to one embodiment.

In operation 1640, the upper patterned mask 900 may have a plurality of second areas corresponding to the plurality of P-designated contact holes (e.g., contact holes 122) and N-designated contact holes (e.g., contact holes 122) and a plurality of upper electrically conductive leads 128, according to one embodiment.

In operation 1642, an upper conduction layer 124 of the flexible thermoelectric device 100 may be formed on top of and through the flexible coverlay 119 using the upper patterned mask 900, according to one embodiment.

In operation 1644, the flexible thermoelectric device 100 may be sealed and protected with an upper dielectric layer 130, according to one embodiment.

Figure 17:
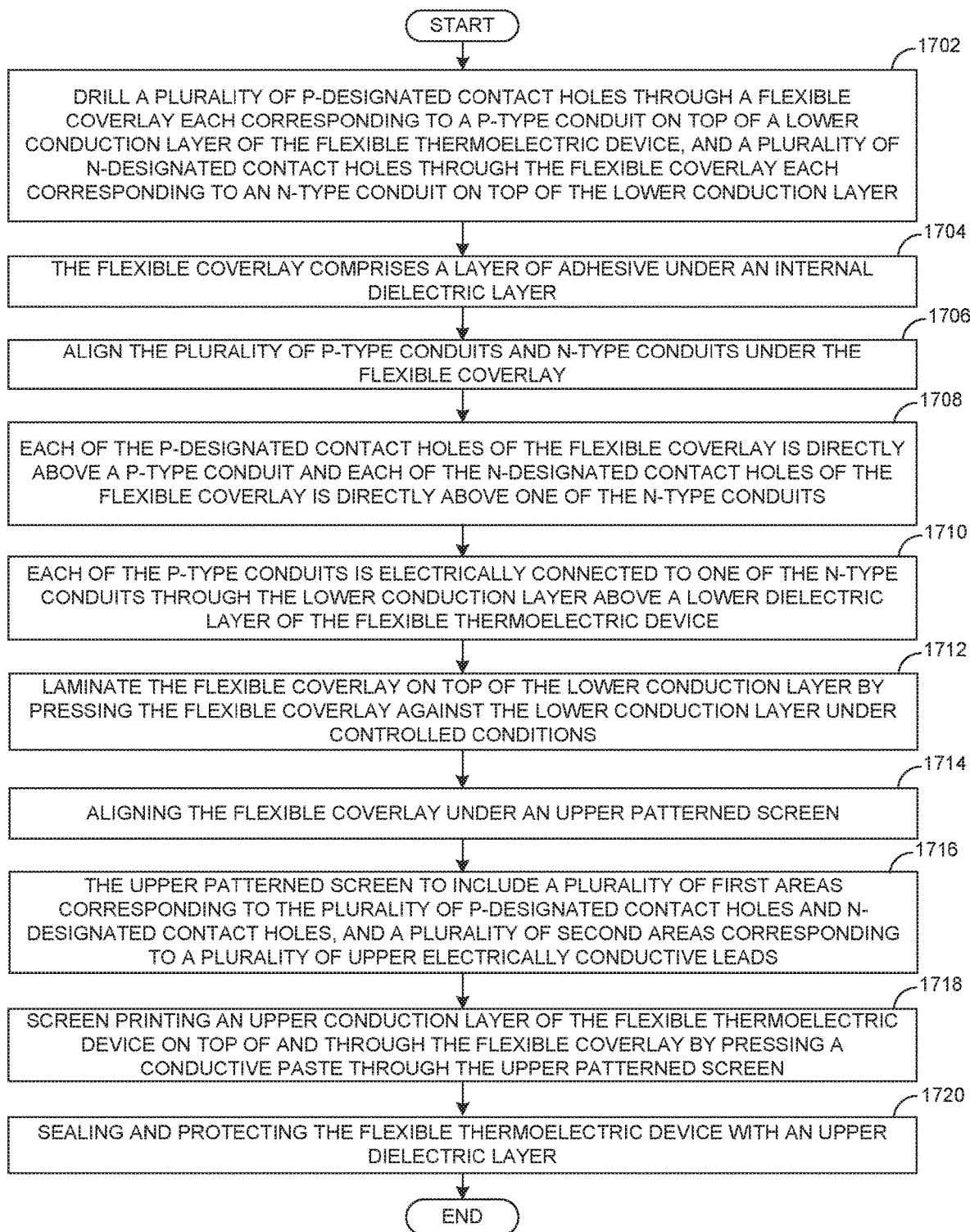
FIG. 17 illustrates yet another process flow to produce a flexible thermoelectric device, according to one embodiment.

FIG. 17 illustrates yet another process flow 1750 to produce a flexible thermoelectric device(s) 100 of FIG. 1, according to one embodiment.

In operation 1702, a plurality of P-designated contact holes (e.g., contact holes 122) may be drilled through a flexible coverlay 119 each corresponding to a P-type conduit 114 on the top of a lower conduction layer 104 of the flexible thermoelectric device 100. A plurality of N-designated contact holes (e.g., contact holes 122) may be drilled through the flexible coverlay 119 each corresponding to an N-type conduit 112 on top of the lower conduction layer 104, according to one embodiment.

In operation 1704, the flexible coverlay 119 may include a layer of adhesive under an internal dielectric layer 118.

In operation 1706, the plurality of P-type conduits 114 and N-type conduits 112 may be aligned with respect to and under the flexible coverlay 119, according to one embodiment.

In operation 1708, each of the P-designated contact holes (e.g., contact holes 122) of the flexible coverlay 119 may be directly above one of the P-type conduits 114 and each of the N-designated contact holes (e.g., contact holes 122) of the coverlay may be directly above one of the N-type conduits 112, according to one embodiment.

In operation 1710, each of the P-type conduits 114 may be electrically connected to one of the N-type conduits 112 through the lower conduction layer 104 above a lower dielectric layer 102 of the flexible thermoelectric device 100, according to one embodiment.

In operation 1712, the flexible coverlay 119 may be laminated on top of the lower conduction layer 104 by pressing the flexible coverlay 119 against the lower conduction layer 104 under controlled conditions, according to one embodiment.

In operation 1714, the flexible coverlay 119 may be aligned under an upper patterned screen (e.g. upper patterned mask 900), according to one embodiment.

In operation 1716, the upper patterned screen (e.g. upper patterned mask 900) may include a plurality of first areas corresponding to the plurality of P-designated contact holes (e.g., contact holes 122) and N-designated contact holes (e.g., contact holes 122), and a plurality of second areas corresponding to a plurality of upper electrically conductive leads 128, according to one embodiment.

In operation 1718, the upper conduction layer 124 of the flexible thermoelectric device 100 may be screen printed on top of and through the flexible coverlay 119 by pressing a conductive paste 304 through the upper patterned screen (e.g. upper patterned mask 900), according to one embodiment.

In operation 1720, the flexible thermoelectric device 100 may be sealed and protected with an upper dielectric layer 130, according to one embodiment.

Figure 18:
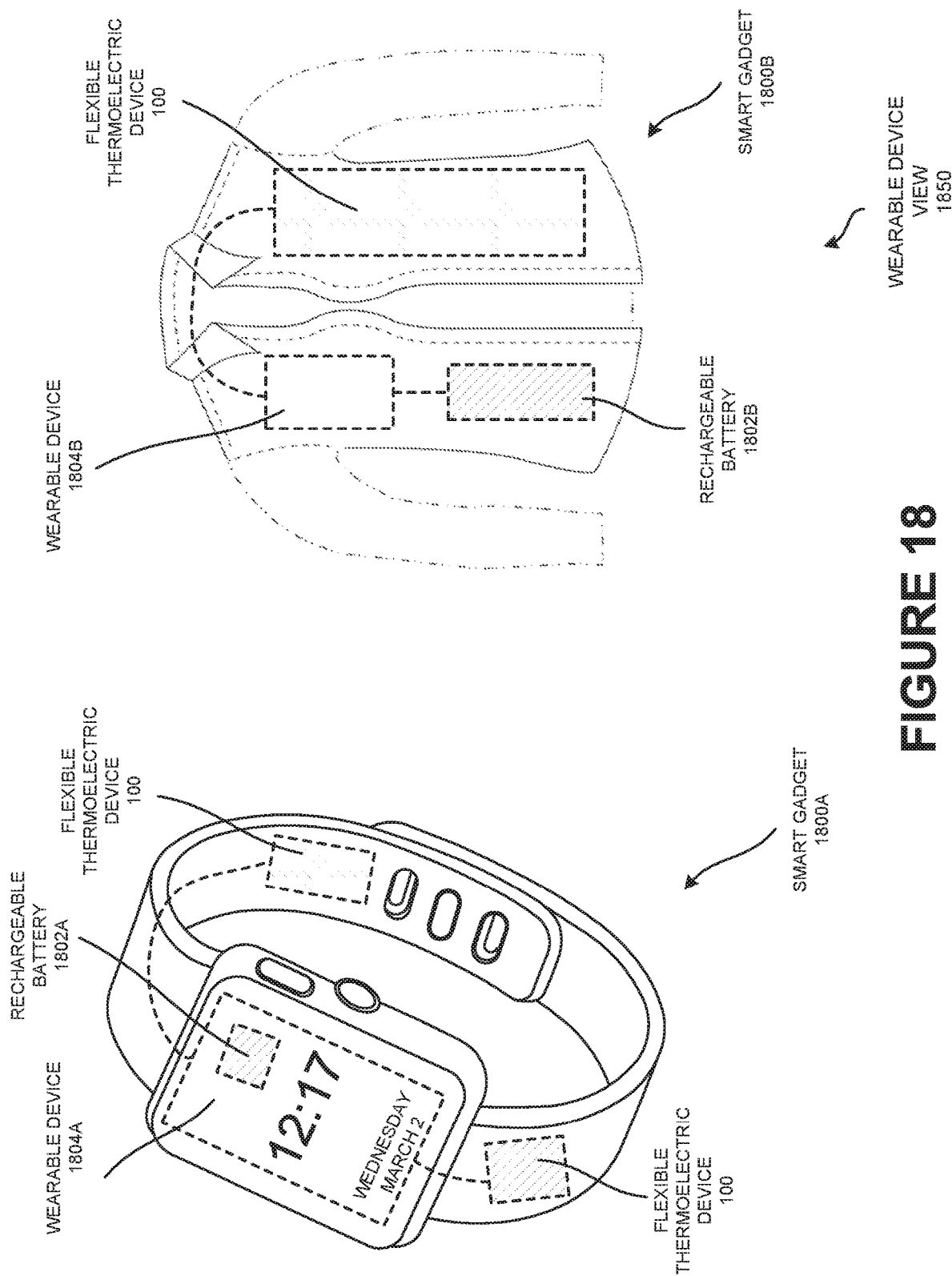
FIG. 18 is a wearable device view of the flexible thermoelectric device of FIG. 1, illustrating two examples of the flexible thermoelectric device harvesting energy for wearable applications, according to one embodiment.

FIG. 18 is a wearable device view 1850 of the flexible thermoelectric device 100 of FIG. 1, illustrating two examples of the flexible thermoelectric device 100 harvesting energy for wearable applications, according to one embodiment. Particularly, FIG. 18 builds on FIG. 1, and further adds smart gadgets 1800A and 1800B, rechargeable batteries 1802A and 1802B, wearable devices 1804A and 1804B.

In the examples, both smart gadgets 1800A and 1800B (e.g., smart watch, smart clothing) may have wearable devices 1804A and 1804B (e.g., embedded processor and memory with user interface, wearable computer, body networked computer) embedded and powered by rechargeable batteries 1802A and 1802B (e.g. lithium ion (Li ion) battery, nickel metal hydride (NiMh) battery, nickel-cadmium (NiCd) battery, nickel-zinc (NiZn) battery, lead-acid battery, fuel cell, flow cell, electrolytic cells, galvanic cells, voltaic pile, wet cell, dry cell, reserve battery). The flexible thermoelectric device 100 may be embedded in the smart gadgets to be used at locations (e.g., wrist band, arm band, head band, sock, shirt, clothing, fabric, accessories) where the flexible thermoelectric device 100 may be subjected to temperature gradients (e.g., between the human body temperature and the ambient temperature) such that the active layer 116 of the flexible thermoelectric device 100 may generate electricity from the temperature gradient. The flexible thermoelectric device 100 may be connected to the wearable devices 1804A and 1804B so that the generated electricity may be used to power the wearable devices 1804A and 1804B. The flexible thermoelectric device 100 may be connected to the rechargeable batteries 1802A and 1802B so that the generated electricity may be stored in the batteries 1802A and 1802B.

The smart gadgets 1800A and/or 1800B may be any wearable device on the body of a human being and/or a creature such as smart phone, smart phone accessory, battery charger, tablet, portable computer, portable scanner, portable tools, remote control, game device, game accessory, smart watch, smart glass, smart arm band, smart wrist band, smart pin, smart comb, smart pen, smart name card, smart purse, smart wallet, smart belt, smart necklace, smart ring, smart email ring, smart hat, smart cap, smart scarf, smart garment, smart fabric, smart shirt, smart pants, smart clothing, smart glove, smart underwear, smart sock, smart shoe, smart bag, smart backpack, smart pet accessory, smart animal accessory, etc.

The smart gadgets 1800A and/or 1800B may also be any device to be placed in, on, through, and/or around any devices and/or systems experiencing temperature gradient among some sides, such as land vehicles, water vehicles, marine vehicles, submarine vehicles, aeronautic vehicles, space vehicles, volcano devices, engines, computers, machineries and components, electromagnetic devices, cables, wires, antennas, solar panels, lamps and lighting devices, heaters, air conditioners, tubing, pipes, water pipes, displays, billboards, TVs, DVDs, audio systems, cooking devices, baking devices, cups, plates, spoons, utensils, building materials, windows, doors, walls, boards, tables, chairs, furniture, floor, ceiling, deck furniture, swimming pool accessories, etc.

The rechargeable battery 1802A and/or 1802B may be a device consisting of two or more electrochemical cells that converts stored chemical energy into electrical energy. During recharging, the rechargeable battery 1802A and/or 1802B converts electrical energy into stored chemical energy. The rechargeable battery 1802A and/or 1802B may also be a device that converts stored energy into electrical energy. The stored energy maybe electrical energy or another form of energy. During recharging, the rechargeable battery 1802A and/or 1802B converts electrical energy into stored energy. The rechargeable battery 1802A and/or 1802B may be in arbitrary shape and size.

The wearable device 1804A and/or 1804B may have a processor, a memory, a display, a sensor, an actuator, a user interface, a network interface, a wireless network interface, and/or other interface.

Other features of the present embodiments will be apparent from the accompanying drawings and from the detailed description that follows.

Low efficiency, high operating temperature combined with higher cost forbid current thermoelectric devices for wider market adoption. Low efficiency may relegate thermoelectric devices to a few applications where their simplicity and ruggedness may outweigh the inefficiency, such as sensors and waste-heat-energy converters. The potential for thermoelectric devices, however, may be much greater. If their efficiency may be increased and reduce the operational temperatures near room temperature (300K), thermoelectric devices may begin to supplant mechanical compressor refrigeration systems, gasoline generators, geothermal power production, and more. Thermoelectric devices may play a significant role in the energy production, home heating/cooling and general energy management of the future.

Low thermal conductivity with higher electrical conductivity is needed for higher ZT. Unfortunately there are no single materials that possess simultaneously higher electrical conductivity and lower thermal conductivity. Most of the recent efforts in research community thus have been reducing thermal conductivity by phonon blocking and/or phonon scattering and/or reducing phonon free mean path.

Thermoelectric devices may be made out of bulk material in the form of ingots and/or pellets. The ingot may be formed from liquid melt and/or from the powder metallurgy route. Each pellet may be attached on a substrate and form a module.

Recent advancements may be made using a thin-film process that allows forming micro bumps using common semiconductor equipment. This allows thousands of micro bumps to form a thermoelectric device to produce meaningful voltage and power output.

Metal particles may be incorporated in a thermoelectric material to form a composite structure. Nano phase metal particles in a polymer matrix may be utilized to form a composite thermoelectric device. Ceramic nanoparticles may be introduced as phonon scattering centers in a thermoelectric device to improve the figure of merit (ZT), which may occur with nano-carbon material units in a thermoelectric matrix.

Quantum super lattice structures may be limited to expensive composite thermoelectric materials and methods and thus limiting the wide spread use of such devices in common market place. Thermoelectric components may be placed in series, but the thermal conductivity may be diminished because the interconnections between the semiconductors may create thermal shorting.

There may be no material that possesses high electrical conductivity and low thermal conductivity simultaneously. Another limitation in current art is each material may behave differently at different temperatures. A thermoelectric cell approach with a flexible substrate may permit stacking. Stacking allows combining different materials with different properties, and may be with or without a spacer. Thermoelectric elements may be connected electrically in series, but thermally in parallel across a temperature gradient. Stacking may allow manufacturers to control electrical conductivity and thermal conductivity independently, and may be able to stack different materials. In one embodiment, the stacked layer may be a single N-type or P-type stack. Additionally, there may be a super lattice for each layer.

A refrigerating effect may be obtained in the flexible thermoelectric device 100 by passing current along a circuit containing dissimilar materials, according to one embodiment. Heat may be absorbed at one junction of the two materials and heat may be released at the other junction, according to one embodiment.

The transfer of heat may be caused by the change in electron energy levels when electrons access the conduction band as defined by quantum physics. The conduction band varies with each material, which means that conducting electrons in some materials may be at a higher energy level than in other materials. When electrons pass down a circuit of dissimilar materials, the electrons alternately extract energy and/or release energy with each change in the conduction band.

The desired refrigerating effect may occur when electrons move to a higher energy level upon change of material. A reverse effect may also occur when electricity is generated from a circuit of dissimilar materials that may be exposed to a temperature differential. This is the physical principle that forms the basis of the thermocouple and is known as the Seebeck effect. The Peltier and Seebeck effects are complementary manifestations of the same physical phenomenon.

There are other applications for the flexible thermoelectric device 100. Voltage generation from temperature differentials in a wide array of situations in different fields offer the potential for application of the flexible thermoelectric device 100. The flexible thermoelectric device 100 may be used in medical applications, e.g. cochlear hearing replacements and devices, nerve stimulation implants; consumer applications, e.g. watches, self-powered toys and novelties; military applications, e.g. wireless personal area networks, ammunition safety sensors, space programs, building environmental control and security.

The flexible thermoelectric device 100 may be integrated to power industrial and/or commercial devices, e.g. wireless sensor networks, automobile tire pressure monitors, wireless HVAC sensors, wireless lighting an energy controls, wireless industrial process control sensors, and oil and gas well head sensors. The flexible thermoelectric device 100 may provide ecological and/or energy applications, e.g. secondary power generation/recovery, electric generation grid device monitor sensors, and environmental condition sensors.

In the field of building automation, the flexible thermoelectric device 100 may have practical applications in security, HVAC, automatic meter reading, lighting control, and access control. In the area of personal health care, the layer composite may have applications in patient monitoring and fitness monitoring. The flexible thermoelectric device 100 may have industrial control applications, e.g. asset management process control and environmental energy management.

Consumer electronics applications may include televisions, VCRs, DVD/CD remotes and/or players, mobile phones, tablets, laptops, household appliances, computer mice, keyboards, joysticks, and/or personal computers and computing peripherals. Residential/light commercial control applications of the layer composite may include security, HVAC, lighting control, access control, and/or lawn & garden irrigation systems.

In one embodiment, while thermally conductive, the flexible thermoelectric device 100 may effectively maintain the temperature differential between opposite ends of the flexible thermoelectric device 100. Thereby, the flexible thermoelectric device 100 may create temperature differentials that may be persistent and thus may optimize the voltage generation from a temperature gradient.

The resistance to heat transfer attributable to the flexible thermoelectric device 100 perpetuates the overall temperature differential and thus may effectively sustain the temperature gradient across each stratum of the thermoelectric layers and accordingly the flexible thermoelectric device 100 as a whole. Because of this resistance to heat transfer, the flexible thermoelectric device 100 may serve as a more efficient means of voltage generation since the temperature differentials at each layer of thermoelectric material may not require additional heat sinks and/or energy-intensive cooling techniques that may be employed to maintain the temperature differential.

While serving as a thermoelectric device, the material composition of the thermoelectric layer may be altered and adjusted according to the specific needs of each application. The flexible thermoelectric device 100 is material independent, according to one embodiment. If the application of the flexible thermoelectric device 100 requires a specific temperature range, e.g. environments with temperatures higher than 800 degrees K, then a particular material may be employed in the thermoelectric layers. For example, Bismuth Telluride may be appropriate in one temperature range, while Silicon Germanium may be more suitable in another temperature.

The thermoelectric layer may include whatever material is most appropriate and best suited to the conditions of the application. Temperature may be one variable. Other factors may be electrical conductivity, malleability, texture, etc. Because the flexible thermoelectric device 100 is material independent, the material best suited for the relevant application may be chosen, thus optimizing the voltage generation and other properties for each application.

Additionally, because the flexible thermoelectric device 100 is material independent and because of the effectiveness of the flexible thermoelectric device 100 in maintaining a temperature gradient across its strata, multiple types of materials may be employed in composing the thermoelectric layer. For example, the thermoelectric layer may contain $Cu_2Te$, $Bi_2Te_3$, and/or $Sb_2Te_3$, all in one cell.

Because the thermoelectric layers may maintain a temperature differential effectively, materials impractical at one temperature may still be used in the thermoelectric layer at a different depth with a different temperature where the material may be practical. For example, if the hot surface of the flexible thermoelectric device 100 precludes use of one material because it may melt and/or not be as thermally or electrically conductive at that temperature, that material may still be utilized at the cooler end of the flexible thermoelectric device 100 because the flexible thermoelectric device 100 maintains the temperature differential and the material may be used toward the cool surface of the flexible thermoelectric device 100. Thus, the flexible thermoelectric device(s) 100 characteristic of sustaining the temperature gradient may permit the combination of different materials and thereby optimize the inherent properties of component materials.

The flexible thermoelectric device 100 may have a stratum-like structure, according to one embodiment. Because the flexible thermoelectric device 100 inhibits the flow of heat across the layers, there may be a relatively smaller temperature differential per each layer. However, because the flexible thermoelectric device 100 may comprise as many layers as a manufacturer and/or consumer desire, according to one embodiment, the temperature differentials across each layer may sum up to a larger overall temperature differential across the entire device.

The flexible thermoelectric device 100 may harvest energy from waste heat at lower costs with a higher ZT value, higher efficiency, lower manufacturing costs, and may be easily integrated into existing manufacturing process systems for applications. Furthermore, because of its flexibility, the device may be used in other wearable electronics to utilize body heat.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims. Furthermore, the specification and/or drawings may be regarded in an illustrative rather than a restrictive sense.

What is claimed is:

1. A method of producing a flexible thermoelectric device comprising:

drilling a plurality of P-designated contact holes through a flexible coverlay each corresponding to a P-type conduit of a plurality of P-type conduits directly on top of a lower conduction layer of the flexible thermoelectric device, and a plurality of N-designated contact holes through the flexible coverlay each corresponding to an N-type conduit of a plurality of N-type conduits directly on top of the lower conduction layer, the flexible coverlay comprising a layer of adhesive under an internal dielectric layer;

aligning the plurality of P-type conduits and the plurality of N-type conduits under the flexible coverlay such that the each P-designated contact hole of the flexible coverlay is directly above one of the P-type conduits and the each N-designated contact hole of the flexible coverlay is directly above one of the N-type conduits, wherein each P-type conduit is electrically connected to one of the N-type conduits through the lower conduction layer directly above a lower dielectric layer of the flexible thermoelectric device;

laminating the flexible coverlay on top of the lower conduction layer by pressing the flexible coverlay against the lower conduction layer such that:
the layer of adhesive deforms and fills a space around the each of the P-type conduits and each of the N-type conduits, and
the layer of adhesive directly contacts the lower conduction layer;

aligning the flexible coverlay under an upper patterned screen, wherein the upper patterned screen comprises a plurality of first areas corresponding to the plurality of P-designated contact holes and the plurality of N-designated contact holes, and a plurality of second areas corresponding to a plurality of upper electrically conductive leads; and screen printing an upper conduction layer of the flexible thermoelectric device on top of and through the flexible coverlay by pressing a conductive paste through the upper patterned screen such that:

the conductive paste penetrates the each P-designated contact hole to form an electrically conductive contact coupled to the top of a corresponding one P-type conduit, the conductive paste penetrates the each N-designated contact hole to form another electrically conductive contact coupled to the top of a corresponding one N-type conduit, and the conductive paste at each second area forms an upper electrically conductive lead connecting a pair of electrically conductive contacts, wherein the plurality of P-type conduits and the plurality of N-type conduits are electrically connected in series.

2. The method of claim 1, further comprising at least one of:

sealing and protecting the flexible thermoelectric device with an upper dielectric layer;

aligning a lower patterned mask comprising a plurality of third areas corresponding to a plurality of electrically conductive pads and a plurality of lower electrically conductive leads on top of a flexible metal clad, the flexible metal clad comprising a layer of metal directly on top of the lower dielectric layer; and forming, in accordance with the plurality of third areas of the aligned lower patterned mask, the lower conduction layer of the flexible thermoelectric device in which:

the plurality of electrically conductive pads comprises a plurality of N-designated conductive pads and a plurality of P-designated conductive pads disposed directly across a surface of the lower dielectric layer, each of the plurality of lower electrically conductive leads connects a pair of a neighboring N-designated conductive pad and a P-designated conductive pad, the each of the plurality of lower electrically conductive leads extends between the N-designated conductive pad and the P-designated conductive pad of the corresponding pair across the surface of the lower dielectric layer, parallel to a length of both the N-designated conductive pad and the P-designated conductive pad of the corresponding pair, and the each of the plurality of lower electrically conductive leads is narrower in width compared to a width of both the N-designated conductive pad and the P-designated conductive pad of the corresponding pair, the width of both the N-designated conductive pad and the P-designated conductive pad of the corresponding pair being a dimension perpendicular to the length thereof.

3. The method of claim 2, further comprising:

aligning a P-designated mask on top of the lower conduction layer of the flexible metal clad, the P-designated mask having a first pattern corresponding to the plurality of P-designated conductive pads of the lower conduction layer such that the plurality of P-designated conductive pads is exposed through the P-designated mask;

forming the plurality of P-type conduits with at least one layer of P-type thermoelectric material using the P-designated mask and at least one kind of P-type thermoelectric material, wherein the each of the plurality of P-type conduits is located directly on top of one of the plurality of P-designated conductive pads of the flexible metal clad exposed through the P-designated mask;

aligning an N-designated mask on the top of the lower conduction layer of the flexible metal clad, the N-designated mask having a second pattern corresponding to the plurality of N-designated conductive pads of the lower conduction layer such that the plurality of N-designated conductive pads is exposed through the N-designated mask; and forming the plurality of N-type conduits with at least one layer of N-type thermoelectric material using the N-designated mask and at least one kind of N-type thermoelectric material, wherein the each of the plurality of N-type conduits is located directly on top of one of the plurality of N-designated conductive pads of the flexible metal clad exposed through the N-designated mask.

4. The method of claim 3, further comprising:

align g a PN-designated mask above the lower conduction layer of the flexible metal clad, the PN-designated mask having a third pattern corresponding to at least one of the plurality of P-designated conductive pads and the plurality of N-designated conductive pads such that the at least one of the plurality of P-designated conductive pads and the plurality of N-designated conductive pads is configured to be exposed through the PN-designated mask; and forming at least one barrier layer using the PN-designated mask such that the at east one barrier layer is between one of:
two layers of thermoelectric material,
an electrically conductive pad and a first layer of thermoelectric material, and
an electrically conductive contact and a second layer of thermoelectric material, the at least one barrier layer being electrically conductive and having a higher melting temperature than substances separated thereby.

5. The method of claim 3, comprising at least one of:
the formation of at least one of: the lower conduction layer, the plurality of N-type conduits, the plurality of P-type conduits, the upper conduction layer and the upper dielectric layer involving at least one of: vacuum deposition, sputter deposition, Chemical Vapor Deposition (CVD), physical vapor deposition, atomic layer deposition (ALD), electroplating, screen printing, another deposition method and an etching method; and
at least one of: the lower dielectric layer, the internal dielectric layer, and the upper dielectric layer being at least one of: a flexible polymer, a polymer composite, polyimide, polyacrylate, polyvinyl acetate and mylar.

6. The method of claim 3, comprising:
the internal dielectric layer being a poor thermal conductor having a thermal conductivity value less than 1 watt per meter kelvin (W/(mK)); and
both the upper dielectric layer and the lower dielectric layer being electrical insulators and good thermal conductors having a thermal conductivity value greater than 5 watts per meter kelvin (W/(mK)).

7. The method of claim 3, further comprising at least one of:
thermally insulating the each of the plurality of P-type conduits and the each of the plurality of N-type conduits so that a heat energy flows vertically through the conduit without leaking to other conduits on the sides;
utilizing a soft mask for at least one of: the lower patterned mask, the P-designated mask, and the N-designated mask;
applying a layer of photoresist to at least one of the flexible metal clad, the lower conduction layer, the plurality of P-type conduits, the plurality of N-type conduits, the flexible coverlay, and the upper conduction layer of the flexible thermoelectric device;

aligning the flexible metal clad of the flexible thermoelectric device with a photo mask, the photo mask having a fourth pattern corresponding to the at least one of: the lower patterned mask, the P-designated mask, and the N-designated mask such that a light from a light source behind the photo mask is configured to be partially blocked by the photo mask according to the fourth pattern on the photo mask;

exposing the layer of photoresist and the at least one of: the flexible metal clad, the lower conduction layer, the plurality of P-type conduits, the plurality of N-type conduits, the flexible coverlay, and the upper conduction layer of the flexible thermoelectric device to the light from the light source through the photo mask;

forming a layer of at least one of P-type thermoelectric material, N-type thermoelectric material, metal and dielectric on the flexible thermoelectric device according to the fourth pattern on the photo mask;

etching the formed layer of the at least one of P-type thermoelectric material, the N-type thermoelectric material, the metal and the dielectric on the flexible thermoelectric device according to the fourth pattern on the photo mask; and removing any remaining photoresist.

8. The method of claim 3, comprising at least one of:
a hard mask being used for at least one of the lower patterned mask, the P-designated mask, and the N-designated mask; and
a stencil being used for the at least one of the lower patterned mask, the P-designated mask, and the N-designated mask.

9. The method of claim 3, further comprising at least one of:
applying an electroless nickel immersion gold (ENIG) process to surface plate a layer of nickel and a layer of gold over the layer of metal of the flexible metal clad; and
accomplishing all of the aligning of the N-designated mask, the forming of the N-type conduits, the aligning of the P-designated mask, and the forming of the P-type conduits within a same vacuum system while continuing to maintain a vacuum.

10. A method of producing a flexible thermoelectric device comprising:
drilling a plurality of P-designated contact holes through a flexible coverlay each corresponding to a P-type conduit of a plurality of P-type conduits directly on top of a lower conduction layer of the flexible thermoelectric device, and a plurality of N-designated contact holes through the flexible coverlay each corresponding to an N-type conduit of a plurality of N-type conduits directly on top of the lower conduction layer, the flexible coverlay comprising a layer of adhesive under an internal dielectric layer;

aligning the plurality of P-type conduits and the plurality of N-type conduits under the flexible coverlay such that the each P-designated contact hole of the flexible coverlay is directly above one of the P-type conduits and the each N-designated contact hole of the flexible coverlay is directly above one of the N-type conduits, wherein each P-type conduit is electrically connected to one of the N-type conduits through the lower conduction layer directly above a lower dielectric layer of the flexible thermoelectric device;

laminating the flexible coverlay on top of the lower conduction layer by pressing the flexible coverlay against the lower conduction layer such that:

the layer of adhesive deforms and fills a space around the each of the P-type conduits and each of the N-type conduits, and the layer of adhesive directly contacts the lower conduction layer;

aligning the flexible coverlay under an upper patterned screen, wherein the upper patterned screen comprises a plurality of first areas corresponding to the plurality of P-designated contact holes and the plurality of N-designated contact holes, and a plurality of second areas corresponding to a plurality of upper electrically conductive leads;

screen printing an upper conduction layer e flexible thermoelectric device on top of and through the flexible coverlay by pressing a conductive paste through the upper patterned screen such that:

the conductive paste penetrates the each P-designated contact hole to form an electrically conductive contact coupled to the top of a corresponding one P-type conduit, the conductive paste penetrates the each N-designated contact hole to form another electrically conductive contact coupled to the top of a corresponding one N-type conduit, and the conductive paste at each second area forms an upper electrically conductive lead connecting a pair of electrically conductive contacts; and thermally insulating the each of the plurality of P-type conduits and the each of the plurality of N-type conduits so that a heat energy flows vertically through the conduit without leaking to other conduits on the sides, wherein the plurality of P-type conduits and the plurality of N-type conduits are electrically connected in series.

11. The method of claim 10, further comprising at least one of:

sealing and protecting the flexible thermoelectric device with an upper dielectric layer;

aligning a lower patterned mask comprising a plurality of third areas corresponding to a plurality of electrically conductive pads and a plurality of lower electrically conductive leads on top of a flexible metal clad, the flexible metal clad comprising a layer of metal directly on top of the lower dielectric layer; and forming, in accordance with the plurality of third areas of the aligned lower patterned mask, the lower conduction layer of the flexible thermoelectric device in which:

the plurality of electrically conductive pads comprises a plurality of N-designated conductive pads and a plurality of P-designated conductive pads disposed directly across a surface of the lower dielectric layer, each of the plurality of lower electrically conductive leads connects a pair of a neighboring N-designated conductive pad and a P-designated conductive pad, the each of the plurality of lower electrically conductive leads extends between the N-designated conductive pad and the P-designated conductive pad of the corresponding pair across the surface of the lower dielectric layer, parallel to a length of both the N-designated conductive pad and the P-designated conductive pad of the corresponding pair, and the each of the plurality of lower electrically conductive leads is narrower in width compared to a width of both the N-designated conductive pad and the P-designated conductive pad of the corresponding pair, the width of both the N-designated conductive pad and the P-designated conductive pad of the corresponding pair being a dimension perpendicular to the length thereof.

12. The method of claim 11, further comprising:

aligning a P-designated mask on top of the lower conduction layer of the flexible metal clad, the P-designated mask having a first pattern corresponding to the plurality of P-designated conductive pads of the lower conduction layer such that the plurality of P-designated conductive pads is exposed through the P-designated mask;

forming the plurality of P-type conduits with at least one layer of P-type thermoelectric material using the P-designated mask and at least one kind of P-type thermoelectric material, wherein the each of the plurality of P-type conduits is located directly on top of one of the plurality of P-designated conductive pads of the flexible metal clad exposed through the P-designated mask;

aligning an N-designated mask on the top of the lower conduction layer of the flexible metal clad, the N-designated mask having a second pattern corresponding to the plurality of N-designated conductive pads of the lower conduction layer such that the plurality of N-designated conductive pads is exposed through the N-designated mask; and forming the plurality of N-type conduits with at least one layer of N-type thermoelectric material using the N-designated mask and at least one kind of N-type thermoelectric material, wherein the each of the plurality of N-type conduits is located directly on top of one of the plurality of N-designated conductive pads of the flexible metal clad exposed through the N-designated mask.

13. The method of claim 12, further comprising:

aligning a PN-designated mask above the lower conduction layer of the flexible metal clad, the PN-designated mask having a third pattern corresponding to at least one of the plurality of P-designated conductive pads and the plurality of N-designated conductive pads such that the at least one of the plurality of P-designated conductive pads and the plurality of N-designated conductive pads is configured to be exposed through the PN-designated mask; and forming at least one barrier layer using the PN-designated mask such that the at least one barrier layer is between one of:

two layers of thermoelectric material, an electrically conductive pad and a first layer of thermoelectric material, and an electrically conductive contact and a second layer of thermoelectric material, the at least one harrier layer being electrically conductive and having a higher melting temperature than substances separated thereby.

14. The method of claim 12, comprising at least one of:

the formation of at least one of: the lower conduction layer, the plurality of N-type conduits, the plurality of P-type conduits, the upper conduction layer and the upper dielectric layer involving at least one of: vacuum deposition, sputter deposition, CVD, physical vapor deposition, ALD, electroplating, screen printing, another deposition method and an etching method; and at east one of: the lower dielectric layer, the internal dielectric layer, and the upper dielectric layer being at least one of: a flexible polymer, a polymer composite, polyimide, polyacrylate, polyvinyl acetate and mylar.

15. The method of claim 12, comprising:
the internal dielectric layer being a poor thermal conductor having a thermal conductivity value less than 1 watt per meter kelvin (W/(mK)); and
both the upper dielectric layer and the lower dielectric layer being electrical insulators and good thermal conductors having a thermal conductivity value greater than 5 watts per meter kelvin (W/(mK)).

16. The method of claim 12, further comprising at least one of:
utilizing a soft mask for at least one of: the lower patterned mask, the P-designated mask, and the N-designated mask;
applying a layer of photoresist to at least one of the flexible metal clad, the lower conduction layer, plurality of P-type conduits, the plurality of N-type conduits, the flexible coverlay, and the upper conduction layer of the flexible thermoelectric device;
aligning the flexible metal clad of the flexible thermoelectric device with a photo mask, the photo mask having a fourth pattern corresponding to the at least one of: the lower patterned mask, the P-designated mask, and the N-designated mask such that a light a light source behind the photo mask is configured to be partially blocked by the photo mask according to the fourth pattern on the photo mask;
exposing the layer of photoresist and the at least one of: the flexible metal clad, the lower conduction layer, the plurality of P-type conduits, the plurality of N-type conduits, the flexible coverlay, and the upper conduction layer of the flexible thermoelectric device to the light from the light source through the photo mask;
forming a layer of at least one of P-type thermoelectric material, N-type thermoelectric material, metal and dielectric on the flexible thermoelectric device according to the fourth pattern on the photo mask;
etching the formed layer of the at least one of P-type thermoelectric material, the N-type thermoelectric material, the metal and the dielectric on the flexible thermoelectric device according to the fourth pattern on the photo mask; and
removing any remaining photoresist.

17. The method of claim 12, comprising at least one of:
a hard mask being used for at least one of the lower patterned mask, the P-designated mask, and the N-designated mask; and
a stencil being used for the at least one of the lower patterned mask, the P-designated mask, and the N-designated mask.

18. The method of claim 12, further comprising at least one of:
applying an electroless nickel immersion gold (ENIG) process to surface plate a layer of nickel and a layer of gold over the layer metal of the flexible metal clad; and
accomplishing all of the aligning of the N-designated mask, the forming of the N-type conduits, the aligning of the P-designated mask, and the forming of the P-type conduits within a same vacuum system while continuing to maintain a vacuum.

19. A method of producing a flexible thermoelectric device comprising:
drilling a plurality of P-designated contact holes through a flexible coverlay each corresponding to a P-type conduit of a plurality of P-type conduits directly on top of a lower conduction layer of the flexible thermoelectric device, and a plurality of N-designated contact holes through the flexible coverlay each corresponding to an N-type conduit of a plurality of N-type conduits directly on top of the lower conduction layer the flexible coverlay comprising a layer of adhesive under an internal dielectric layer;
aligning the plurality of P-type conduits and the plurality of N-type conduits under the flexible coverlay such that the each P-designated contact hole of the flexible coverlay is directly above one of the P-type conduits and the each N-designated contact hole of the flexible coverlay is directly above one of the N-type conduits, wherein each P-type conduit is electrically connected to one of the N-type conduits through the lower conduction layer directly above a lower dielectric layer of the flexible thermoelectric device;
laminating the flexible coverlay on top of the lower conduction layer by pressing the flexible coverlay against the lower conduction layer such that:
the layer of adhesive deforms and fills a space around the each of the P-type conduits and each of the N-type conduits, and
the layer of adhesive directly contacts the lower conduction layer;
aligning the flexible coverlay under an upper patterned screen, wherein the upper patterned screen comprises a plurality of first areas corresponding to the plurality of P-designated contact holes and the plurality of N-designated contact holes, and a plurality of second areas corresponding to a plurality of upper electrically conductive leads;
screen printing an upper conduction layer of the flexible thermoelectric device on top of and through the flexible coverlay by pressing a conductive paste through the upper patterned screen such that:
the conductive paste penetrates the each P-designated contact hole to form an electrically conductive contact coupled to the top of a corresponding one P-type conduit,
the conductive paste penetrates the each N-designated contact hole to form another electrically conductive contact coupled to the top of a corresponding one N-type conduit, and
the conductive paste at each second area forms an upper electrically conductive lead connecting a pair of electrically conductive contacts;
thermally insulating the each of the plurality of P-type conduits and the each of the plurality of N-type conduits so that a heat energy flows vertically through the conduit without leaking to other conduits on the sides; and
sealing and protecting the flexible thermoelectric device with an upper dielectric layer,
wherein the plurality of P-type conduits and the plurality of N-type conduits are electrically connected in series.

20. The method of claim 19, further comprising at least one of:
aligning a lower patterned mask comprising a plurality of third areas corresponding to a plurality of electrically conductive pads and a plurality of lower electrically conductive leads on top of a flexible metal clad, the flexible metal clad comprising a layer of metal directly on top of the lower dielectric layer; and
forming, in accordance with the plurality of first areas of the aligned lower patterned mask, the lower conduction layer of the flexible thermoelectric device in which:
the plurality of electrically conductive pads comprises a plurality of N-designated conductive pads and a plurality of P-designated conductive pads disposed directly across a surface of the lower dielectric layer, each of the plurality of lower electrically conductive leads connects a pair of a neighboring N-designated conductive pad and a P-designated conductive pad, the each of the plurality of lower electrically conductive leads extends between the N-designated conductive pad and the P-designated conductive pad of the corresponding pair across the surface of the lower dielectric layer, parallel to a length of both the N-designated conductive pad and the P-designated conductive pad of the corresponding pair, and the each of the plurality of lower electrically conductive leads is narrower in width compared to a width of both the N-designated conductive pad and the P-designated conductive pad of the corresponding pair, the width of both the N-designated conductive pad and the P-designated conductive pad of the corresponding pair being a dimension perpendicular to the length thereof.

* * * * *